(12) United States Patent
Barton

(10) Patent No.: US 10,972,082 B2
(45) Date of Patent: Apr. 6, 2021

(54) METHOD AND APPARATUS FOR CROSS CORRELATION

(71) Applicant: NPARBOR, INC., Camas, WA (US)

(72) Inventor: David Carl Barton, Camas, WA (US)

(73) Assignee: NPARBOR, INC., Camas, WA (US)

( * ) Notice: Subject to any disclaimer, the term of this patent is extended or adjusted under 35 U.S.C. 154(b) by 0 days.

(21) Appl. No.: 17/099,755

(22) Filed: Nov. 16, 2020

(65) Prior Publication Data
US 2021/0075409 A1    Mar. 11, 2021

Related U.S. Application Data

(63) Continuation of application No. PCT/US2020/022869, filed on Mar. 15, 2020.

(60) Provisional application No. 62/819,590, filed on Mar. 17, 2019.

(51) Int. Cl.
*H03K 5/00* (2006.01)
*G06N 3/04* (2006.01)

(52) U.S. Cl.
CPC ............... *H03K 5/00* (2013.01); *G06N 3/049* (2013.01); *H03K 2005/00058* (2013.01)

(58) Field of Classification Search
CPC .. H03K 5/19; H03K 5/22; H03K 5/26; H03K 5/159; G06F 17/15; G06N 3/02; G06N 3/06
See application file for complete search history.

(56) References Cited

U.S. PATENT DOCUMENTS

| 7,430,546 B1 | 9/2008 | Suri |
| 8,346,692 B2 | 1/2013 | Rouat et al. |
| 9,798,751 B2 | 10/2017 | Birdwell et al. |
| 9,858,304 B2 | 1/2018 | Marcus et al. |

(Continued)

FOREIGN PATENT DOCUMENTS

JP    2001-053684 A    2/2001

OTHER PUBLICATIONS

USPTO as PCT ISA: International Search Report and Written Opinion for International App. No. PCT/US2002/022869. dated Jun. 6, 2020 (y/m/d). 9 pgs.

(Continued)

*Primary Examiner* — Lincoln D Donovan
*Assistant Examiner* — Colleen J O Toole
(74) *Attorney, Agent, or Firm* — Kaplan IP Law, PLLC; Jonathan T. Kaplan

(57) ABSTRACT

A multi-stream cross correlator for spiking neural networks, where each stream contains significant stochastic content. At least one event occurs, with a fixed temporal relationship across at least two streams. Each stream is treated as a Frame Of Reference (FOR), and subject to an adjustable delay based on comparison to the Other streams. For each spike of the FOR, a timing analysis, relative to the last and current FOR spikes, is completed by comparing Post and Pre accumulators. Also, a new timing analysis is begun, with the current FOR spike, by restarting the production of Post and Pre weighting functions, the values of which are accumulated, upon the occurrence of each Other spike, until a next FOR spike. A one-spike delay unit can be used, if time-neutral conflict resolution is used. The average spike rate of the FOR can be determined and used for the Post and Pre weighting functions.

5 Claims, 19 Drawing Sheets

(56) References Cited

U.S. PATENT DOCUMENTS

| | | |
|---|---|---|
| 2004/0196183 A1 | 10/2004 | Roh |
| 2013/0117211 A1* | 5/2013 | Hunzinger ............. G06N 3/082 706/25 |
| 2014/0052679 A1 | 2/2014 | Sinyayskiy et al. |
| 2015/0262054 A1 | 9/2015 | Cary et al. |
| 2016/0224886 A1 | 8/2016 | Akopyan et al. |
| 2018/0174026 A1 | 6/2018 | Davies |

OTHER PUBLICATIONS

Wall et al. "A Comparison of Sound Localisation Techniques using Cross-Correlation and Spiking Neural Networks for Mobile Robotics." The IEEE 2011 International Joint Conference on Neural Networks, San Jose, CA. Jul. 2011. [retrieved May 18, 2020 from https://repository.uel.ac.uk/item/860q8] 7 pgs, numbered 1981-1987.

USPTO as PCT ISA: International Search Report and Written Opinion for International App. No. PCT/US2002/035547. dated Sep. 4, 2020 (y/m/d). 11 pgs.

Tchumatchenko et al. "Spike correlations—what can they tell about synchrony?." In: Front. Neurosci., May 11, 2011. 17 pgs.

Lee et al. "Training Deep Spiking Neural Networks Using Backpropagation." In: Front. Neurosci., Nov. 8, 2016. 24 pgs.

\* cited by examiner

Multi-stream Cross Correlator

Cross Correlator Unit (CCU) Functional Block Diagram

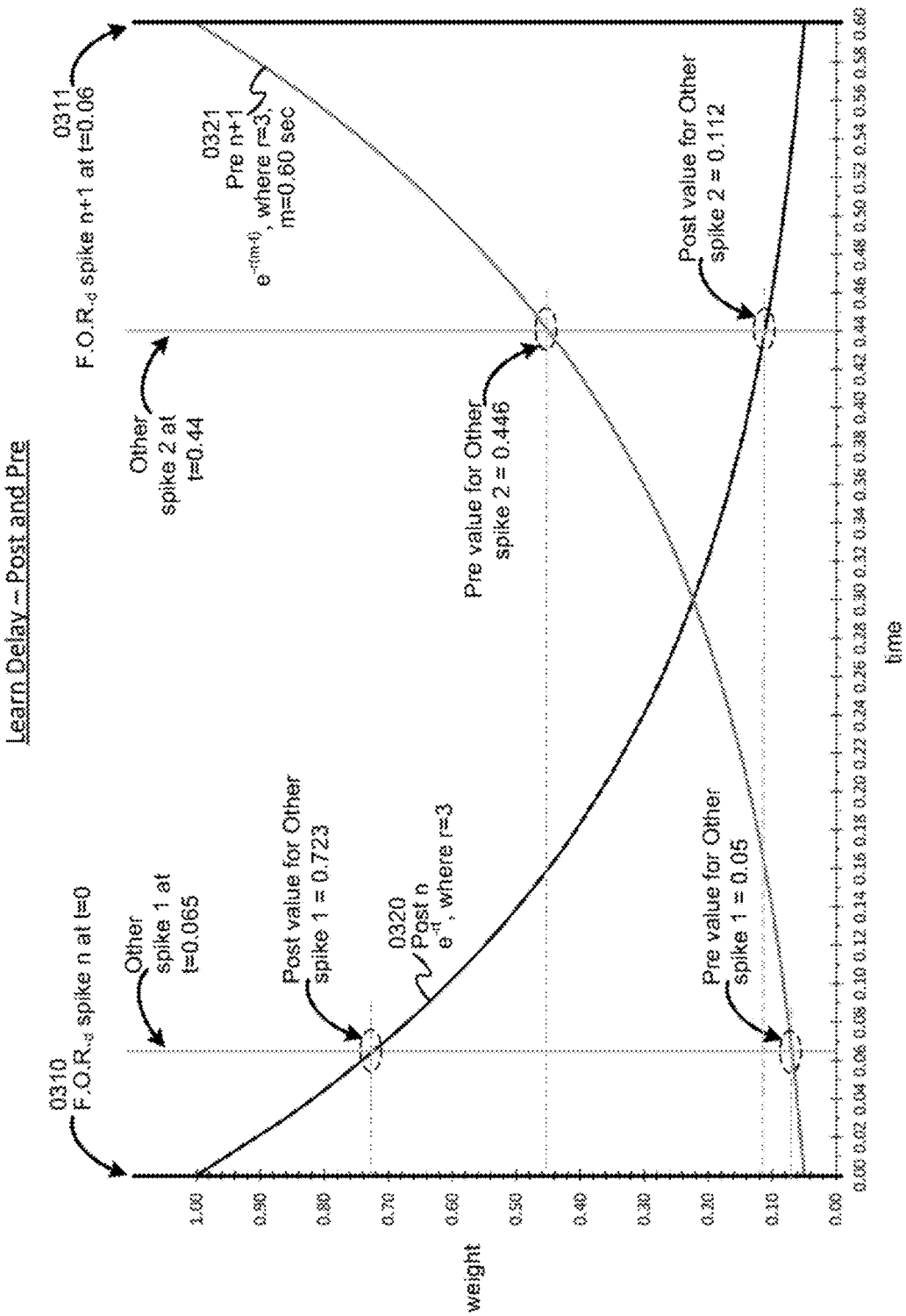

FIGURE 4

```
1   Learn_Delay_PC
2   # Operates each time a spike is received by Learn Delay, whether it is an F.O.R.d from Learn
3   # Delay's companion Produce Delay, or received at Learn Delay's Other input.
4
5       R = Rate of decay, for exponential decrease of Post curve, or increase of Pre curve.
6       IS_MINE = true if current spike is from Learn Delay's companion Produce Delay, and
7       false otherwise.
8       T = time of current spike, that caused the present execution of Learn Delay to begin.
9       TLO = Time of last Other spike.
10      TLF = Time of last F.O.R.d spike from Learn Delay's companion Produce Delay.
11      preAcc = Accumulates a unit value for each Other spike, with each unit value subjected
12      to exponential decay, in accordance with the time between the occurrence of the unit
13      value's Other spike and the next following F.O.R.d spike.
14      postAcc = Accumulates the current value of the Post curve, at each time an Other spike
15      occurs.
16      D = Delay value, for execution by Produce Delay, that is being learned.
17      D_LR = Learning rate for delay.
18      # D_LR is the unit of adjustment to Produce Delay, with all such adjustments, either
19      # greater or smaller, accumulated by D.  Should be small enough to satisfy precision
20      # requirements, and large enough to satisfy time-to-correlation requirements.
21
22      preAcc *= exp(R * (T - TLO))
23      # Further decay any unit values accumulated through previous executions of below.
24
25      If not IS_MINE:  # Current spike is an Other:
26              preAcc += 1
27              # Accumulate unit value, which will be decayed according to above, until the next
28              # F.O.R.d spike is received.
29
30              postAcc += exp(R * (T - TLF))
31              # Accumulate current value of the Post, as it has decayed since last F.O.R.d.
32              TLO = T
33              # Prepare for next Other spike.
34      else:  # Current spike is an F.O.R.d:
35              if preAcc != postAcc:
36              # Perfect balance means any adjustment to D would be incorrect. Usually means
37              # no spikes arrived from other connections and both accumulators are zero.
38                      D += -D_LR if preAcc > postAcc else D_LR
39                      # Adjust delay shorter or longer, based on balance.
40                      D = keep_in_bounds(D)
41                      # Ensure D stays within acceptable limits for maximum and minimum.
42              preAcc = postAcc = 0
43              # Reset accumulators to start next F.O.R.d frame of reference.
44              TLF = T
45              # Update last time this Learn Delay received an F.O.R.d spike.
```

Learn Delay – Read Accumulators & Control

Learn Delay – postAcc

Learn Delay – preAcc

Produce Delay

Produce Delay

Cross Correlator Unit (CCU) Functional Block Diagram

<u>Learn Rate All</u>

Learn Rate All

Learn Rate All

Learn Rate All

Learn Rate All

Learn Delay – postAcc

Learn Delay – preAcc

Produce Delay

METHOD AND APPARATUS FOR CROSS CORRELATION

This application is a continuation of the following International Application, to which benefit is claimed:

"Method and Apparatus for Cross Correlation," with an International Filing Date of 2020 Mar. 15 (y/m/d), having inventor David Carl Barton and International App. No. PCT/US2020/022869.

International App. No. PCT/US2020/022869 claims priority to, and benefit of, the following U.S. Provisional Patent Application:

"Method and Apparatus for Cross Correlation," filed 2019 Mar. 17 (y/m/d), having inventor David Carl Barton and App. No. 62/819,590.

This application also herein incorporates by reference, in its entirety, International App. No. PCT/US2020/022869 and U.S. Provisional Patent Application No. 62/819,590.

International App. No. PCT/US2020/022869 incorporates by reference, in its entirety, U.S. Provisional Patent Application No. 62/819,590.

TECHNICAL FIELD

The present invention relates generally to cross correlation, and, more particularly, to cross correlation of data streams with significant stochastic content.

BACKGROUND ART

Cross correlation is well understood in signal processing, and often used to find the relative delay between signal streams in a variety of applications. Established methods of cross correlation compare signal similarity at multiple relative delay offsets, typically seeking the offset of maximum similarity.

Many optimizations exist to mitigate the computational cost of the repetitive comparisons required, including the use of FFT and various sliding window approaches. In addition to their computational expense, established methods also suffer from the disadvantage of introducing high latency into a system, both because of the need to perform many comparisons, and the need for a memory buffer when processing streaming data. The buffer is required to enable bidirectional search, for both positive and negative delay offsets, on an ongoing basis.

Accordingly, there exists a need for a method of cross correlation with lower latency, and that does not require buffering.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 3 depicts a functional implementation of Learn Delay, using each pair of spikes, present at its F.O.R.$_d$ input, as a frame of reference for analyzing any spikes occurring at Learn Delay's Other input.

FIG. 4 depicts an example pseudo-coded implementation of Learn Delay, based on the Python programming language.

MODE(S) FOR CARRYING OUT THE INVENTION

Reference will now be made in detail to various embodiments of the invention, examples of which are illustrated in the accompanying drawings. Wherever possible, the same reference numbers will be used throughout the drawings to refer to the same or like parts.

Please refer to the Section 3 ("Glossary of Selected Terms") for the definition of selected terms used below.

| Table of Contents to Detailed Description | | | |
|---|---|---|---|
| 1 | | | Introduction |
| 2 | | | Cross Correlation Unit |
| | 2.1 | | General Considerations |
| | 2.2 | | Learn Delay |
| | | 2.2.1 | Functional Description |
| | | 2.2.2 | Sequential Operation and Pseudo-Coded Implementation |
| | | 2.2.3 | Electrical Implementation |
| | 2.3 | | Produce Delay - Lossy Version |
| | | 2.3.1 | Conflict Resolution |
| | | 2.3.2 | Electrical Implementation |
| | 2.4 | | Learn Rate All |
| 3 | | | Glossary of Selected Terms |
| 4 | | | Computing Equipment |

1 Introduction

Cross correlation is known to have many important applications. Among these, cross correlation is expected to continue to gain importance in the area of spiking neural networks, where relative spike timing can be crucial to proper operation.

Figure 1:
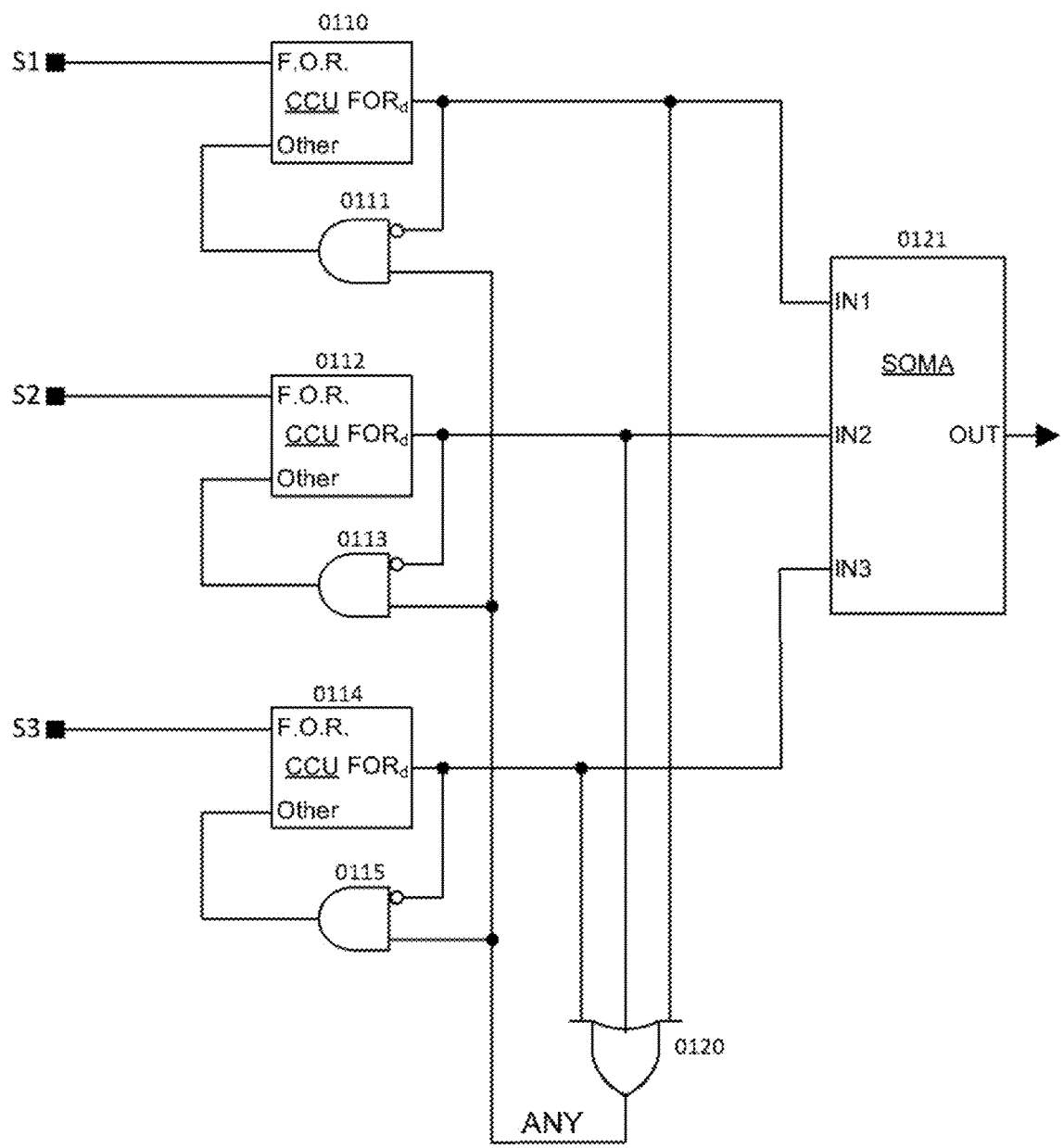
FIG. 1 depicts an example application scenario, of a multi-stream cross correlator, in the area of spiking neural networks.

FIG. 1 depicts an example application scenario, in the area of spiking neural networks. The inputs on the left are three streams of spikes: S1, S2, and S3. Each spike stream is expected to contain significant random (or stochastic) content.

With regard to the stochastic content, the temporal size of inter-spike gaps (or ISG's) assume a random distribution (often Poisson), and each ISG i is within the following range:

$$0 \text{ sec} < i < \infty \text{ sec}$$

For the full temporal range of i, we shall refer to the average spike rate for a spike stream as $r_{ALL}$ (since it is the rate including all spikes that can occur).

Such content is stochastic both in relation to the stream in which it occurs, as well as relative to the other streams. However, there are also expected to occur non-random events, that manifest themselves across two or more of the input streams. (In the following explanation, we will often refer to a non-random event as simply an "event.")

Each of streams S1, S2, and S3 is coupled to, respectively, an F.O.R. input of a Cross Correlation Unit (or CCU): 0110, 0112, and 0114. Each CCU has an output labeled "$FOR_d$." As can be seen, each $FOR_d$ output connects to an input of a "Soma" 0121. At its most basic functional level, the Soma can be designed to act as a kind of coincidence detector, producing an output spike whenever a spike simultaneously appears at each of its inputs.

In the following discussion, three input streams were chosen for purposes of explanatory convenience. It will be readily appreciated that a system, such as that of FIG. 1, can apply, with no change in principles of operation, to an arbitrarily large number of inputs. A minimum of two input streams is required. As a whole, a system such as FIG. 1 can be viewed as a biologically-inspired model of a neuron. While biologically-inspired, from an engineering (and non-biological) perspective, FIG. 1 can be understood to represent a Multi-stream Cross Correlator or "MCC."

When an event occurs, in two or more input streams of an MCC, its manifestation, in each input stream, is expected to have a fixed temporal relationship, with respect to its manifestation in the other spike streams. While multi-stream manifestations of an event are expected to have a fixed temporal relationship with respect to each other, it is also expected that such manifestations will not occur at a same time.

Any other spike (i.e., any non-event spike), when considered both within the input stream in which it occurs as well as in relation to the other input streams, is expected to have a random relationship with respect to all other non-event spikes. We shall also refer any such non-event spike as a "random spike."

The job of each of CCU's 0110, 0112, and 0114 is to determine a delay, or temporal offset, such that as many event manifestations as possible, across the multiple streams, occur simultaneously at the CCU's outputs (and therefore simultaneously at the inputs to Soma 0121).

More specifically, each CCU of FIG. 01 can be observed as having two inputs:
FOR, and
Other.

"FOR" (that may alternatively be written as "F.O.R.") means "Frame Of Reference." (Unless context indicates otherwise, any use herein of the term "FOR" or "F.O.R." is a reference to a "Frame Of Reference," and not to the preposition "for.") The spike stream presented to a CCU's FOR input appears, after some modification, at the CCU's $FOR_d$ output. A CCU has the possibility of modifying its $FOR_d$ output stream, relative to the spikes appearing at its FOR input, by inserting a delay. The "Other" input, for each CCU, is intended to be a union of the spikes appearing at the $FOR_d$ outputs of the other CCU's (i.e., the other CCU's connected to a same Soma).

As can be seen, the Other input of each CCU is determined as follows. First, the output spikes of all CCU's are unioned together, by OR gate 0120, to form a single combined spike stream. The output of this OR gate is labeled "ANY," because a spike is expected to occur at its output so long as it occurs at the $FOR_d$ output of any CCU.

Each of CCU's 0110, 0112, and 0114 is provided with, respectively, an AND gate 0111, 0113, and 0115. As can be seen, each AND gate filters (i.e., removes) the spike stream its CCU's Other input receives. Specifically, any spikes contributed by that AND gate's CCU are removed.

2 Cross Correlation Unit 2.1 General Considerations

In contrast to conventional correlation and cross-correlation techniques, the MCC of the present invention relies upon the presence of large numbers (e.g., hundreds or thousands) of random spikes.

The MCC operates by having each CCU operate essentially independently of the other CCU's. The exception to independent operation is the fact that each CCU receives (at its Other input) the union of the $FOR_d$ outputs of the other CCU's (rather than, for example, a union of the spike streams as presented to the FOR inputs of the other CCU's).

Figure 2:
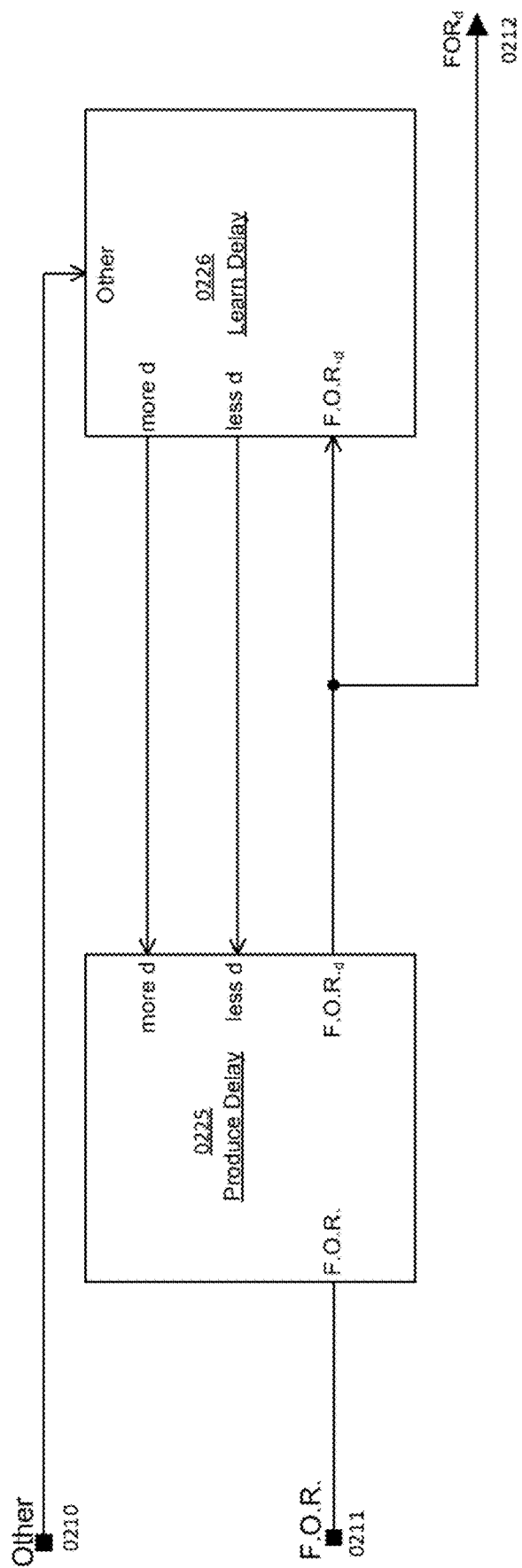
FIG. 2 is a functional block diagram of an example internal structure, for each CCU of FIG. 1.

FIG. 2 is a functional block diagram of an example internal structure, for each CCU of FIG. 1.

As can be seen, a CCU is comprised of two main units:
Produce Delay (block 0225), and
Learn Delay (block 0226).

Produce Delay accepts an input spike stream (at its F.O.R. input), and produces a delayed version of this input stream at its output (called $F.O.R._d$). The F.O.R. input of Produce Delay is coupled to the F.O.R. input of the CCU (labeled 0211), and the $F.O.R._d$ output of Produce Delay is coupled to the $F.O.R._d$ output of the CCU (labeled 0212).

Learn Delay accepts the CCU's Other spike stream (from the CCU's Other input 0210), as well as accepting (at Learn Delay's $F.O.R._d$ input) the $F.O.R._d$ output of Produce Delay. Learn Delay uses each pair of spikes, present at its $F.O.R._d$ input, as a frame of reference for analyzing any spikes occurring at Learn Delay's Other input.

If Produce Delay incorporates sufficient memory, it can reproduce (at its $F.O.R._d$ output) a spike stream that, except for the possibility of delay, is identical to the spike stream at its F.O.R. input. We can refer to this as a lossless version of Produce Delay.

Depending upon the application, the memory of Produce Delay can be implemented with analog or digital equipment. For a digital implementation, Produce Delay can comprise, for example, a FIFO (First In First Out) queue, or buffer, implemented with semiconductor random access memory (RAM). For an analog implementation, Produce Delay can comprise any suitable signal or wave guide, such as an electrical cable or a free-space wave propagation cavity.

In general, however, a lossless version of Produce Delay can require an unbounded (or unlimited) amount of memory.

Another important aspect of the present invention is utilizing the stochastic nature of the spike stream, presented to a CCU's F.O.R. input, to produce a lossy version of $F.O.R._d$ at Produce Delay's output. In fact, a memory of only one spike (at a time), by Produce Delay, can be sufficient to produce a useful correlated spike stream at a CCU's $F.O.R._d$ output. When using storage of only one spike, Produce Delay can be viewed as a kind of "timer." When a spike appears at its F.O.R. input, the timer can be started. At the conclusion of the delay period, the timer produces a spike for Produce Delay's F.O.R.$_d$ output. Use of a single spike memory is discussed below, in Section 2.3 ("Produce Delay").

2.2 Learn Delay 2.2.1 Functional Description

As introduced above, Learn Delay uses each pair of spikes, present at its F.O.R.$_d$ input, as a frame of reference for analyzing any spikes occurring at Learn Delay's Other input. FIG. 3 depicts an example situation of this kind.

As can be seen, FIG. 3 contains two axes:

A horizontal time axis, where: 0.00 sec.≤t≤0.60 sec.

A vertical axis used to assign weights to each Other spike (explained further below), where: 0.00≤weight≤1.00.

Let us call a successive pair of spikes at Learn Delay's F.O.R.$_d$ input, that serve as a framework for evaluation of Other spikes, n and n+1. The vertical line at time t=0.00 (in addition to representing the weight axis) depicts spike n (this spike is also labeled 0310). Conversely, spike n+1 is pictured at t=0.60 (this spike is also labeled 0311). The magnitude of the n and n+1 spikes, along the vertical axis, is not relevant, and has simply been chosen for graphical presentation purposes.

The weight axis is relevant to curves 0320 and 0321. As can be seen, 0320 is an exponential decay curve, of the form $e^{-rt}$, where r is rate, t is time, and r (for purposes of example) equals 3. Conversely, 0321 is an exponential increase curve, of the form $e^{-r(m-t)}$, where r and t are the same as for 0320, and m (for "max" time) equals 0.60 sec. For reasons to be explained just below, curves 0320 and 0321 are also referred to as, respectively, "Post" and "Pre."

Each Other spike, that occurs between F.O.R.$_d$ spikes n and n+1, is assigned both a Post and Pre value. An Other spike, where its Post value is greater than its Pre value, is characterized as being more strongly "post" (or after) spike n than "pre" (or before) spike n+1. Conversely, a spike where its Pre value is greater than its Post value is characterized as being more strongly "pre" (or before) spike n+1 than "post" (or after) spike n.

FIG. 3 depicts two example Other spikes with the following values:

Other spike 1:
t=0.065 sec.
Post value=0.723
Pre value=0.05

Other spike 2:
t=0.44 sec.
Post value=0.112
Pre value=0.446

As can be seen, each Other spike is given two weights, depending upon where it intersects the Post and Pre weighting curves.

Across the multiple Other spikes that can occur, between a pair of F.O.R.$_d$ spikes n and n+1, net tendency, towards being "post" or "pre," can be determined and corrected as follows:

accumulate a sum of all the Post values (that we shall also call "postAcc"), and accumulate a sum of all the Pre's values (that we shall also call "preAcc").

If postAcc>preAcc:

Other spike streams are regarded as, on balance, occurring after the spikes of F.O.R.$_d$. This also means the F.O.R.$_d$ stream is, on balance, early.

Learn Delay (e.g., Learn Delay block 0226 of FIG. 2) can seek to correct the earliness by issuing a command (such as a pulse) at its "more d" output.

In response to the "more d" command, Produce Delay (e.g., see Produce Delay block 0225) can increase, by a certain incremental amount, the delay between its F.O.R. input and F.O.R.$_d$ output.

If preAcc>postAcc:

Other spike streams are regarded as, on balance, occurring before the spikes of F.O.R.$_d$. This also means the F.O.R.$_d$ stream is, on balance, late.

Learn Delay can seek to correct the lateness by issuing a command (such as a pulse) at its "less d" output.

In response, Produce Delay can decrease, by a certain incremental amount, the delay between its F.O.R. input and F.O.R.$_d$ output.

The incremental amount by which the delay of Learn Delay changes (in response to a "more d" or "less d" command), can be selected based upon the particular application, and its requirement of speed versus accuracy. In general, a smaller increment (also called a slower learning rate) increases the time for a CCU to discover a value of delay that achieves best synchronization of its events with its Other streams. However, a smaller increment has the advantage of resulting in a more accurate determination of the necessary delay value.

While exponential curves, both decreasing and increasing, have been shown, for purposes of Post and Pre weighting, a wide variety of functions can be suitable. Major criteria for a suitable function include:

A Pre function that is the symmetric opposite of the Post function.

Post and Pre functions that are at a maximum value at, respectively, the time of spike n and n+1.

Post and Pre functions that monotonically decrease from their maximum value.

2.2.2 Sequential Operation and Pseudo-Coded Implementation

The discussion of the previous sub-section explained operation of Learn Delay in a way consistent with the following spikes being available at one time:

Spikes n and n+1, of the F.O.R.$_d$ input, and

Any spikes present at Learn Delay's Other input, during the time interval between the n and n+1 F.O.R.$_d$ spikes.

During actual operation, a CCU (and the MCC of which it is a part) is expected to operate on a spike-by-spike basis. For example, upon each spike present at Learn Delay's F.O.R.$_d$ input, that we can refer to as a spike n, Learn Delay can be expected to perform two main operations:

If there was an n−1 spike, seek to complete the cross correlation analysis that began with spike n−1. In other words, complete the cross correlation analysis with spikes n−1 and n as the frame of reference.

Begin a new cross correlation analysis, that will complete in the future, upon the arrival of spike n+1. In other words, begin a new cross correlation analysis, where spikes n and n+1 will serve as the frame of reference.

Depending upon the particular application, it may be desirable to implement Learn Delay as a computer program, as electrical hardware, or as a hybrid combination of the two approaches.

FIG. 4 depicts an example pseudo-coded implementation of Learn Delay, based on the Python programming language. Bold-faced text corresponds closely to Python syntax and semantics. Comments are inserted according to Python syntax. Line numbers have been added on the left, to aid explanation. A main departure from Python syntax and semantics is the right hand side of the assignment operators, on lines 5-17. Also, the passing of parameters or other data, into and out of the procedure, is handled informally.

The procedure of FIG. 4 is called "Learn_Delay_PC," where the "PC" suffix indicates pseudo-code. Line 1.

Learn_Delay_PC is invoked each time a spike occurs, at either the F.O.R.$_d$ or Other inputs.

A number of important values and variables are assigned over lines 5-17, but these will be addressed as part of discussing the pseudo-code that utilizes these variables, over lines 22-44.

Line 22, updates the Pre accumulator "preAcc," by causing its contents to undergo exponential decay, relative to the amount of time (i.e., T−TLO) since a last Other spike caused an invocation of Learn_Delay_PC (where T and TLO are defined at lines 8-9 of FIG. 4). As will be explained further below, this exponential decay of preAcc is coupled with adding a unit value to preAcc, at each time an Other spike occurs.

Adding a unit value to preAcc at the time of each Other spike, and causing the preAcc to undergo exponential decay (until the time of the next F.O.R.$_d$ spike), is mathematically equivalent to the preAcc accumulation method discussed above with respect to FIG. 3: adding the value of $e^{-r(m-t)}$ to the preAcc upon the occurrence of each Other spike (where m is the maximum value for t), and having a preAcc that does not decay.

Causing the preAcc to undergo exponential decay may seem an unnecessarily indirect method to accumulate Pre values. As will be discussed in the next sub-section, however, $e^{-r(m-t)}$ is a relatively complex function to implement with electronic hardware, compared with $e^{-rt}$.

Following the update to preAcc, a test is performed for whether the current spike is of type F.O.R.$_d$ or Other. Line 25. An F.O.R.$_d$ spike is regarded as "belonging" to the Learn Delay unit currently executing because its origination is from the Produce Delay unit that belongs to the same CCU. Hence the IS_MINE variable being false indicates receipt of an Other spike, causing the execution of lines 26-33. Otherwise, the current spike is of type F.O.R.$_d$, and lines 35-45 are performed.

Assuming IS_MINE is false, the following steps are executed:
  To account for the current spike being of type Other, a unit value is added to the preAcc. Line 26.
  The value added to postAcc is simply the exponential decay, of a unit value, since the last F.O.R.$_d$ spike. Line 30.
  The time of the last Other spike is updated, in preparation for a next invocation of Learn_Delay_PC. Line 32.

Assuming IS_MINE is true, the following steps are executed:
  As part of completing the currently executing cross correlation analysis, that began with the previous F.O.R.$_d$ spike, a test is first performed to determine whether any Other spikes have occurred. Line 35.
  Assuming at least one Other spike has occurred, the values of preAcc and postAcc are compared. Line 38.
    If preAcc>postAcc, then, on balance, the F.O.R.$_d$ spikes are regarded as late with respect to the Other spikes. The delay from Produce Delay, represented by the variable D, is reduced. The amount of reduction, which controls the learning rate, is represented by the "−D_LR" of line 38.
    If postAcc>preAcc, then, on balance, the F.O.R.$_d$ spikes are regarded as early with respect to the Other spikes. The delay from Produce Delay, represented by the variable D, is increased. The amount of increase, which controls the learning rate, is represented by the "D_LR" of line 38.
  A check can be performed, to ensure that D is kept within permissible limits. Line 40.
  As part of beginning a new cross correlation analysis, the following steps are performed:
    preAcc and postAcc are reset to zero. Line 42.
    The time of the last F.O.R.$_d$ spike is updated to the current time. Line 44.

2.2.3 Electrical Implementation

Figure 5:
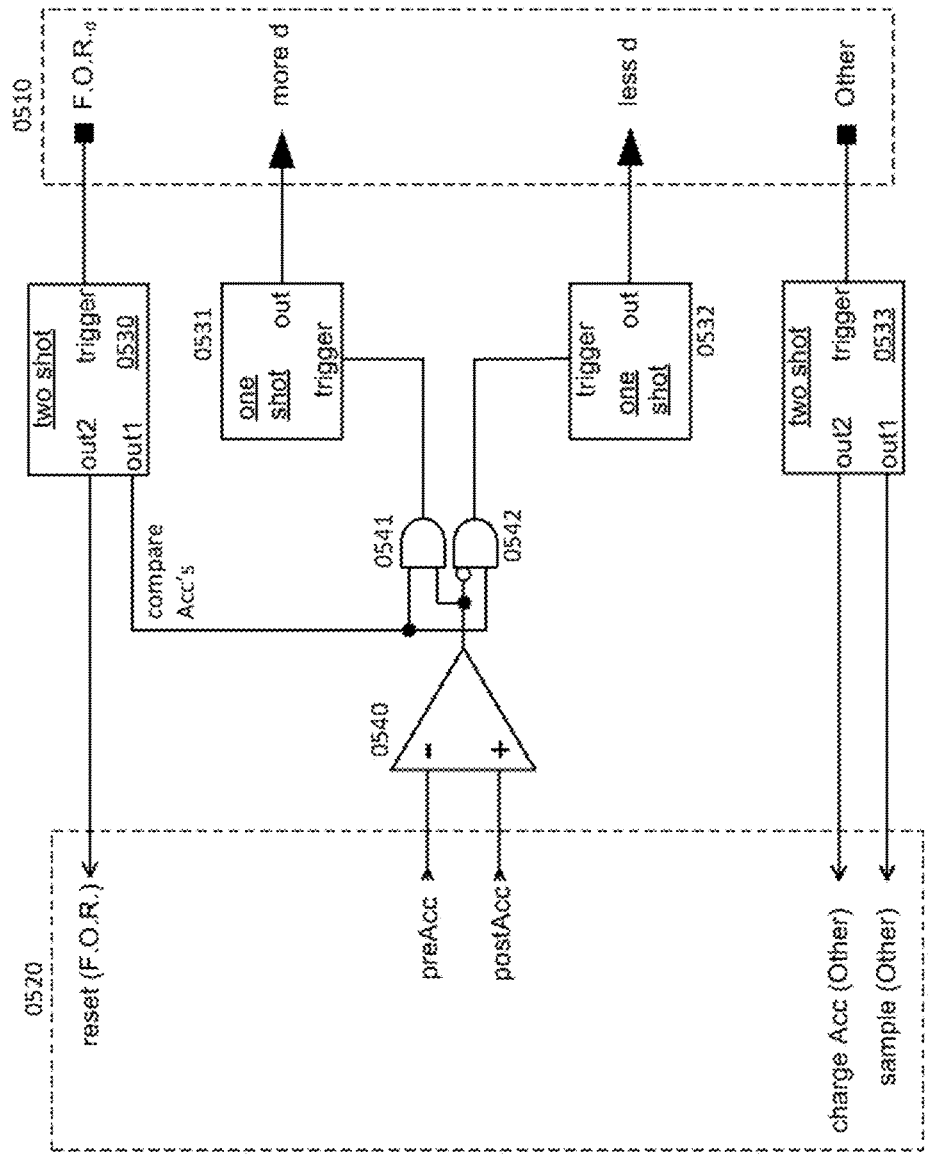
FIGS. 5-7 depict an example electrical implementation for Learn Delay.
Figure 6:
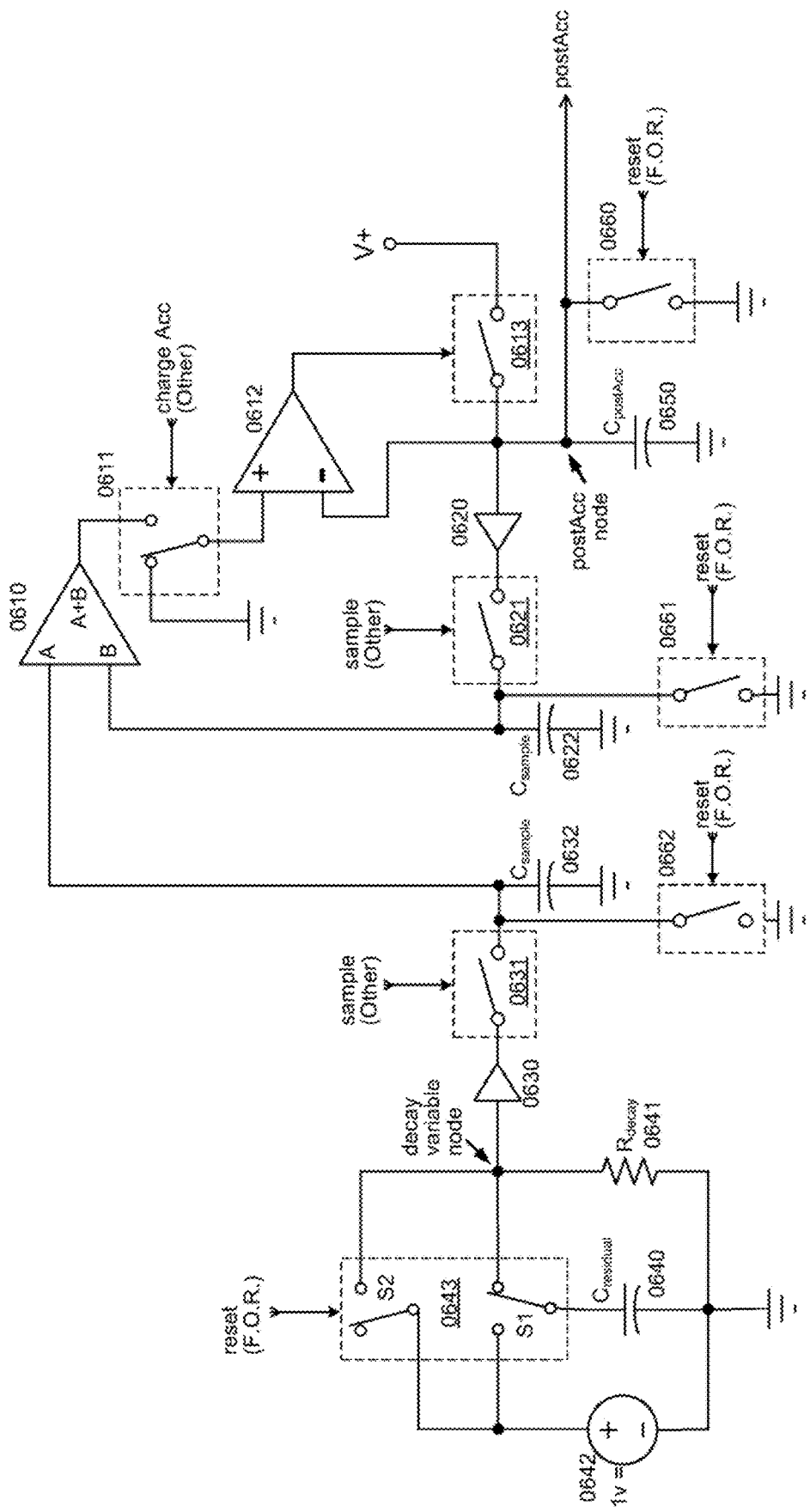
Figure 7:
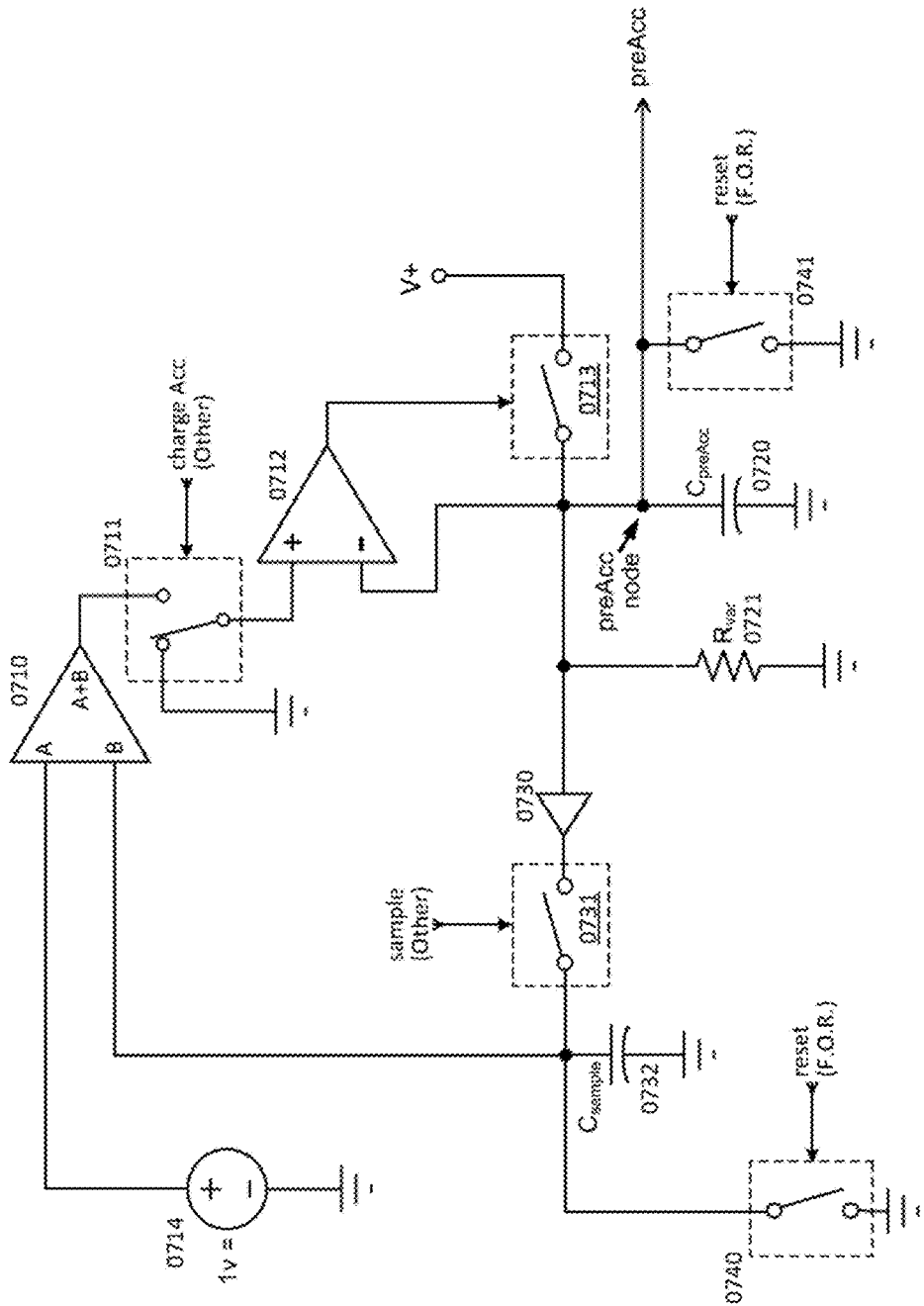

FIGS. 5-7 depict an example electrical implementation for Learn Delay.

FIG. 5 depicts the top-level control and interface of a Learn Delay module. FIG. 6 focuses on circuitry related to accumulating the postAcc value, while FIG. 7 is focused on circuitry related to accumulating the preAcc.

Outline 0510 of FIG. 5 indicates the external interface for Learn Delay, where each connection corresponds to an input or output of Learn Delay functional block 0221, as discussed previously in connection with FIG. 2.

Outline 0520 indicates an internal interface, for Learn Delay, to the postAcc circuitry of FIG. 6 and the preAcc circuitry of FIG. 7.

A discussion of external interface 0510 follows.

Each spike presented to the F.O.R.$_d$ input triggers "two shot" 0530. First, out1 of the two shot completes the current frame of reference, by causing a reading of comparator amplifier 0540. Second, out2 resets the postAcc and preAcc circuitry, such that accumulation across a next frame of reference can begin.

Out1 causes a reading of comparator 0540 by enabling AND gates 0541 and 0542. If the output of comparator 0540 is a logical 0, when the AND gates are enabled, then AND gate 0542 will present a trigger signal to one shot 0532. One shot 0532, when triggered, produces a pulse at the "less d" output (of interface 0510). Conversely, if the output of comparator 0540 is a logical 1, then AND gate 0541 will present a trigger signal to one shot 0531. One shot 0531, when triggered, produces a pulse at the "more d" output (of interface 0510).

Comparator 0540 compares two signals: a signal representative of the preAcc (called "preAcc"), and a signal representative of the postAcc (called "postAcc"). The postAcc signal is produced by the circuitry of FIG. 6, while the preAcc signal is accumulated by the circuitry of FIG. 7. Each of the preAcc and postAcc signals is analog, with a voltage level representing its accumulated value. If the preAcc signal has a higher voltage than postAcc, comparator 0540 outputs a signal representing a logical 0. As discussed above, a logical 0 (when read by out1 of two shot 0530) causes a pulse from the "less d" output. Conversely, if postAcc>preAcc, comparator 0540 outputs a logical 1. As discussed above, a logical 1 (when read by out1 of two shot 0530) causes a pulse from the "more d" output.

The last connection to be discussed, for external interface 0510, is the Other input. Like the F.O.R.$_d$ input, a spike at Other also triggers a two shot. In this case, it is two shot 0533. As will be discussed further below, out1 of two shot 0533 causes (among other actions) a sampling of the current voltage level of each of the postAcc accumulator and preAcc accumulator. Secondly, out2 causes the postAcc and preAcc accumulators to each be charged to a new voltage level.

With regard to FIG. 6, capacitor 0650 maintains a voltage of the postAcc signal (or node). With regard to Post n function 0320, as discussed above with respect to FIG. 3, it is determined by the combination of capacitor 0640 with resistor 0641. The Post n function is available, in FIG. 6, at the decay variable node.

As discussed above, two shot 0530 (at its out2 output) asserts the "reset (F.O.R.)" signal, as part of starting a new frame of reference. With regard to FIG. 6, it can be seen that the reset (F.O.R.) signal causes a reset of the following capacitors:

The accumulation of a postAcc value is reset to zero, by switch 0660 coupling the postAcc node to ground.

Post n function 0320 is reset to a new period of exponential decay by switches S1 and S2 of switching unit 0643. Specifically, for the duration of the reset (F.O.R.) pulse:

S1 couples capacitor 0640 to unit value voltage source 0642, and

S2 ensures, while capacitor 0640 is recharged, that the decay variable node maintains a correct initial value for re-starting an exponential decay.

At the appropriate time, capacitor 0632 is used to hold a sample of the voltage at the decay variable node. It is reset by switch 0662 coupling capacitor 0632 to ground.

At the appropriate time, capacitor 0622 is used to hold a sample of the voltage at the postAcc node. It is reset by switch 0661 coupling capacitor 0622 to ground.

Once the reset (F.O.R.) signal ends, the combination of capacitor 0640 and resistor 0641 begins its exponential decay, with the Post n function being available at the decay variable node.

If an Other spike occurs, subsequent to the reset of the postAcc node (by an $F.O.R._d$ spike), two shot 0533 is triggered. With regard to FIG. 6, it can be seen that the assertion of the "sample (Other)" signal causes the following:

A sampling of the current voltage, at the decay variable node, by the closing of switch 0631.

A sampling of the current voltage, at the postAcc node, by the closing of switch 0621.

Subsequent to the assertion of the "sample (Other)" signal, the following occurs:

Switch 0631 opens, and the sampled voltage of the decay variable node is held by capacitor 0632.

Switch 0621 opens, and the sampled voltage of the postAcc node is held by capacitor 0622.

The voltages held by capacitors 0632 and 0622 are summed, by additive amplifier 0610.

Next, two shot 0533 asserts the "charge Acc (Other)" signal, which closes switch 0611 of FIG. 6. This causes comparator 0612 to compare the voltage at the postAcc node to the output of additive amplifier 0611. The voltage from the additive amplifier will be greater than the postAcc node's voltage by the amount sampled at the decay variable node. Therefore, comparator 0612 will cause switch 0613 to close, and remain closed, until the postAcc node has been charged to a voltage that is essentially equal to the additive amplifier's output.

As can be appreciated, the net effect, of the sequential assertion of the "sample (Other)" and "charge Acc (Other)" signals, is the following. At the time of each Other spike, the voltage of the postAcc node is increased by an amount equal to the then current voltage of the decay variable node.

With regard to FIG. 7, capacitor 0720 maintains a voltage of the preAcc signal (or node). However, as discussed above with respect to the Learn_Delay_PC pseudo-code of FIG. 4, the preAcc node is designed to decay, due to its combination with resistor 0721. As discussed above, the combination of a decaying preAcc node with an addition of a unit voltage for each Other spike, is mathematically equivalent to determining Pre n+1 function 0321 (of FIG. 3) and adding its value to a non-decaying Pre accumulator. The relative simplicity from a circuit implementation perspective, of the decaying preAcc node approach, can be appreciated in FIG. 7.

As discussed above, two shot 0530 (at its out2 output) asserts the "reset (F.O.R.)" signal, as part of starting a new frame of reference. With regard to FIG. 7, it can be seen that the reset (F.O.R.) signal causes a reset of the following capacitors:

The accumulation of a preAcc value is reset to zero, by switch 0741 coupling the preAcc node to ground.

At the appropriate time, capacitor 0732 is used to hold a sample of the voltage at the postAcc node. It is reset by switch 0740 coupling capacitor 0732 to ground.

If an Other spike occurs, subsequent to the reset of the preAcc node (by an $F.O.R._d$ spike), two shot 0533 is triggered. With regard to FIG. 7, it can be seen that the assertion of the "sample (Other)" signal causes the sampling of the current voltage, at the preAcc node, by the closing of switch 0731.

Subsequent to the assertion of the "sample (Other)" signal, the following occurs:

Switch 0731 opens, and the sampled voltage of the preAcc node is held by capacitor 0732.

The voltage held by capacitor 0732 is summed, by additive amplifier 0710, with the unit voltage from voltage source 0714.

Next, two shot 0533 asserts the "charge Acc (Other)" signal, which closes switch 0711 of FIG. 7. This causes comparator 0712 to compare the voltage at the preAcc node to the output of additive amplifier 0710. The voltage from the additive amplifier will be greater than the preAcc node's voltage by the amount provided by unit voltage source 0714. Therefore, comparator 0712 will cause switch 0713 to close, and remain closed, until the preAcc node has been charged to a voltage that is essentially equal to the additive amplifier's output.

As can be appreciated, the net effect, of the sequential assertion of the "sample (Other)" and "charge Acc (Other)" signals, is the following. At the time of each Other spike, the voltage of the preAcc node is increased by an amount equal to unit voltage of voltage source 0714. Subsequent to the increase, the preAcc node will resume its exponential decay until either of the following occurs:

The current frame of reference ends, with the occurrence of an $F.O.R._d$ spike.

Another Other spike occurs.

2.3 Produce Delay—Lossy Version 2.3.1 Conflict Resolution

As discussed above, in Section 2.1 ("General Considerations"), another important aspect of the present invention is the option to utilize the stochastic nature, of the spike stream presented to each CCU's F.O.R. input, to produce a lossy version of $F.O.R._d$ at Produce Delay's output.

A memory of only one spike (at a time), by Produce Delay (e.g., by functional block 0225 of FIG. 2), can be sufficient to produce a useful correlated spike stream at a CCU's $F.O.R._d$ output. In this case, Produce Delay can be viewed as a kind of "timer." When a spike appears at Produce Delay's F.O.R. input, the timer can be started. At the conclusion of the delay period, the timer produces a spike for Produce Delay's $F.O.R._d$ output. Use of a single spike memory is discussed below.

Because a lossy version of Produce Delay requires so much less memory (only one spike) than a lossless version (whose memory needs to be potentially infinite), we will refer to the lossy version as "memoryless."

The key problem, when implementing a memoryless approach, is what we shall call the "conflict resolution" issue. The conflict resolution issue can arise whenever the delay of Produce Delay is greater than 0 sec. Because of the stochastic nature of the spike stream input to each CCU, whenever Produce Delay is in the midst of timing a delay period d, because of an F.O.R. spike x, it is always possible for a next F.O.R. spike x+1 to arrive. There are then two choices:

Ignore spike x+1, and proceed with the timing for spike x until its delay period d is completed. We shall refer to this as the "keep oldest" choice.

Restart the timer, such that a delay period d begins with spike x+1. We shall refer to this as the "keep newest" choice.

Either of these two policies, if applied consistently, has the possibility of being sequentially applied an unbounded number times. For example:

Keep oldest: while a delay d is being timed for a spike x, it is possible for an unbounded number of subsequent F.O.R.$_d$ spikes to arrive. All of which will be ignored.

Keep newest: if a delay d for a spike x is restarted because of a spike x+1, it is possible for a spike x+2 to restart the time period for spike x+1, and it is further possible for a spike x+3 to restart the time period for spike x+2. The restarting of the delay period can continue to occur, a potentially unbounded number of times.

Either of these two choices, if applied exclusively as a policy for conflict resolution, has the problem of introducing a time bias into Learn Delay's comparison of the F.O.R.$_d$ and Other spike streams. Specifically:

Keep oldest: Has the effect of making the F.O.R.$_d$ spike stream appear earlier, with respect to the Other spike stream, than it actually is. The result is that the delay produced by Produce Delay is too large. This effect can be appreciated from the fact that a keep-oldest policy causes later spikes (i.e., spikes after spike x) to be dropped.

Keep newest: Has the effect of making the F.O.R.$_d$ spike stream appear later, with respect to the Other spike stream, than it actually is. The result is that the delay produced by Produce Delay is too small. This effect can be appreciated from the fact that a keep-newest policy causes earlier spikes (e.g., a spike x that is earlier than spike x+1) to be ignored.

The time bias issue can be resolved by any technique that causes, on average, an equal number of choices of each of the keep oldest and keep newest policies. The main difference of FIG. 8 from FIG. 2 is the introduction of a Resolve Conflicts block 0224, within which can be seen a proposed implementation. Functional block 0220 (Produce Delay) of FIG. 8 includes an additional "Delay Done" output that is not present in functional block 225 of FIG. 2. Delay Done is a logical 0 whenever Produce Delay is timing a delay period, and is logical 1 otherwise. Whenever Delay Done is logical 1, AND gate 0230 will permit a spike, at F.O.R. input 0211, to start a delay operation. This makes sense, since there is no conflict, with a pre-existing delay period, under such conditions.

Conversely, we know a conflict situation is present when an F.O.R. spike arrives at input 0211 and Delay Done is logical 0. This situation is decoded for by AND 0233 of the Resolve Conflicts block 0224. AND gate 0233 producing a logical 1 causes one of two operations, depending upon the pre-existing state of flip-flop 0234:

If flip-flop 0234 happens to already produce a logical 1 at its Q output, then that Q output, along with a logical 1 from AND 0233, will cause AND 0232 to produce a signal that (through OR gate 0231) causes a timing restart by Produce Delay. As can be appreciated, this is an execution of the "keep newest" policy.

Conversely, if flip-flop 0234 happens to be producing a logical 0 at its Q output, that logical 0 prevents AND 0232 from producing a signal that causes a timing restart by Produce Delay. This is an execution of the "keep oldest" policy.

Regardless of whether flip-flop 0234 happens to already produce a logical 1, each production of logical 1 by AND 0233 triggers flip-flop 0234 to change state. The net result is that upon each detection of a conflict situation, Resolve Conflicts block 0224 implements a policy based on the current state of flip-flop 0234, and then changes the state of flip-flop 0234, such that the opposite policy is executed next time.

2.3.2 Electrical Implementation

Figure 9:
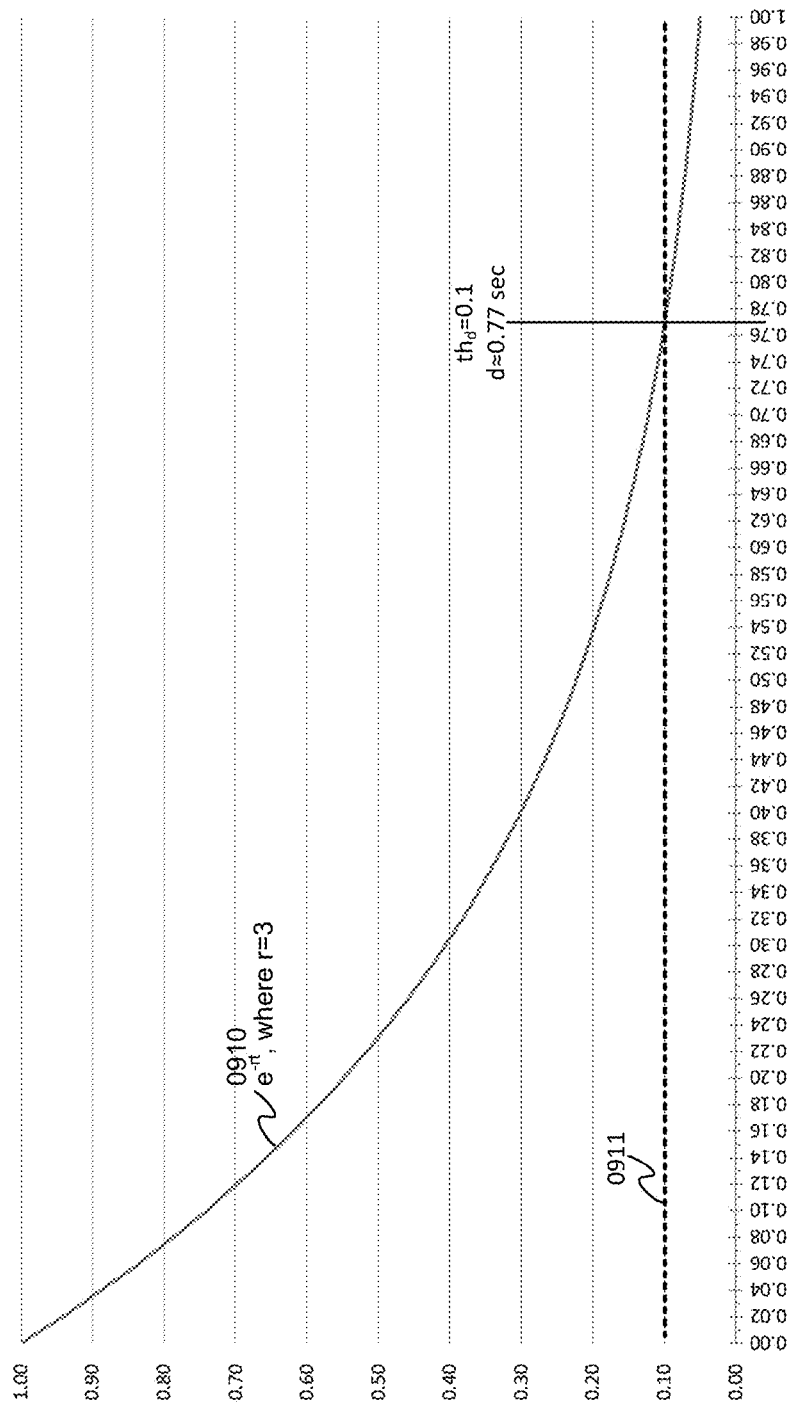
FIG. 9 depicts an example of implementing Produce Delay, by coupling an exponential decay curve with threshold detection.
Figure 10:
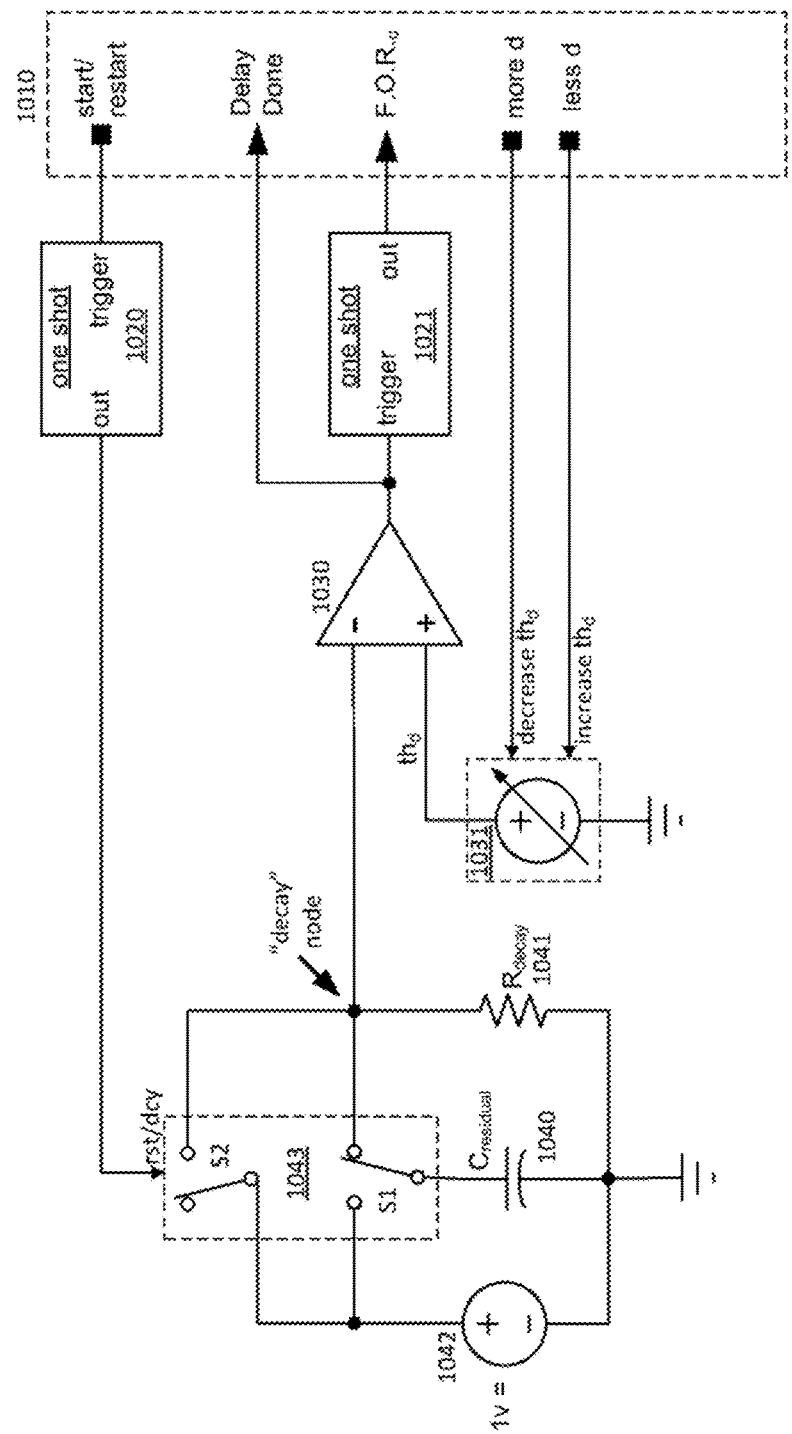
FIG. 10 presents circuitry for implementing the Produce Delay functionality discussed in connection with FIG. 8 for functional block 0220.

FIGS. 9-10 address an example electrical implementation for Produce Delay.

FIG. 9 depicts an example of implementing Produce Delay, by coupling an exponential decay curve (i.e., 0910 is $e^{-rt}$) with threshold detection (horizontal line 0911). In the example of FIG. 9, rate of decay r equals 3, and the threshold to be detected (referred to as th$_d$) equals 0.1. As can be seen, under these conditions, the delay period produced (called "d") is 0.77 sec. As can be appreciated, delay can be increased or decreased by, respectively, lowering or increasing the threshold.

Figure 8:
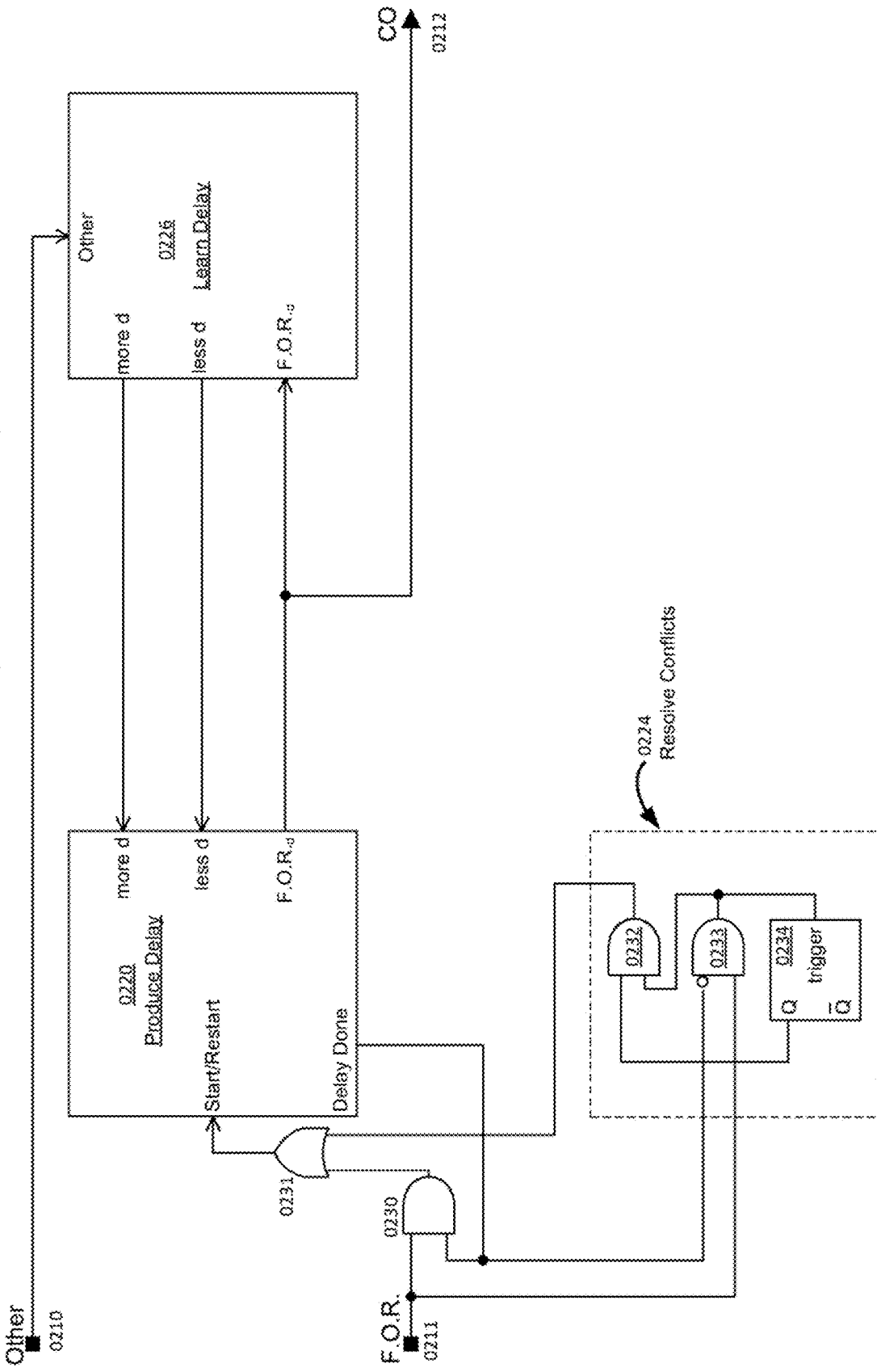
FIG. 8 is a functional block diagram of the CCU of FIG. 2, except a Resolve Conflicts block is added to a memoryless version of Produce Delay.

FIG. 10 presents circuitry for implementing the Produce Delay functionality shown in FIG. 8 for functional block 0220.

Outline 1010 of FIG. 10 indicates the external interface for Produce Delay, where each connection corresponds to an input or output of Produce Delay functional block 0220.

The exponential decay, that forms the basis of Produce Delay's timing ability, is created by the combination of capacitor 1040 with resistor 1041. The decay occurs at the "decay" node, which is applied to the negative input of a comparator amplifier 1030. The threshold (called th$_d$) is set by adjustable voltage source 1031, which is applied to the comparator's positive input. The voltage output by 1031 can be incrementally adjusted lower or higher by, respectively, pulses applied to the "more d" or "less d" inputs to interface 1010. At any one time, the state of voltage source 1031 (i.e., the voltage it is currently set to output) can be kept by a capacitor (not shown).

Each spike at the start/restart input triggers one shot 1020. One shot 1020 generates a pulse that, while asserted, prepares capacitor 1040 to produce a new period of exponential decay by switches S1 and S2 of switching unit 1043. Specifically, for the duration of the one shot's pulse:

S1 couples capacitor 1040 to unit value voltage source 1042, and

S2 ensures, while capacitor 1040 is recharged, that the decay node maintains a correct initial value for re-starting an exponential decay.

Once one shot 1020's signal ends, the combination of capacitor 1040 and resistor 1041 begins its exponential decay. When the voltage of the decay node falls below the voltage output by voltage source 1031, the output of comparator 1030 produces a logical 1. The logical 1 causes both of the following:

The "Delay Done" output, at interface 1010, is asserted. One shot 1021 is triggered, its pulse constituting the spike output at the F.O.R.$_d$ output of interface 1010.

2.4 Learn Rate all

As presented above, both the Produce Delay and Learn Delay functional blocks (e.g., blocks 0220 and 0226 of FIG. 8) work through the use exponential decay curves. The rate of decay r, for these functions, can be selected based upon the expected spike frequencies of the particular application.

However, it can be useful to include, in a CCU, a functional block that can discover the average spike rate (which we shall call $r_{ALL}$) at its F.O.R. input. In general, $r_{ALL}$ is a good value to use as r, for the decay functions of Produce Delay and Learn Delay.

For example, with respect to Learn Delay as shown in FIG. 3, $r_{ALL}$ can be used for the Post and Pre functions. Using this value for r tends to ensure the Other spikes are located on regions where each function is changing relatively rapidly, and is therefore easier to measure. A similar advantage is achieved by using $r_{ALL}$ for the decay rate (e.g., see function 0910 of FIG. 9) by which Produce Delay measures delay.

Figure 11:
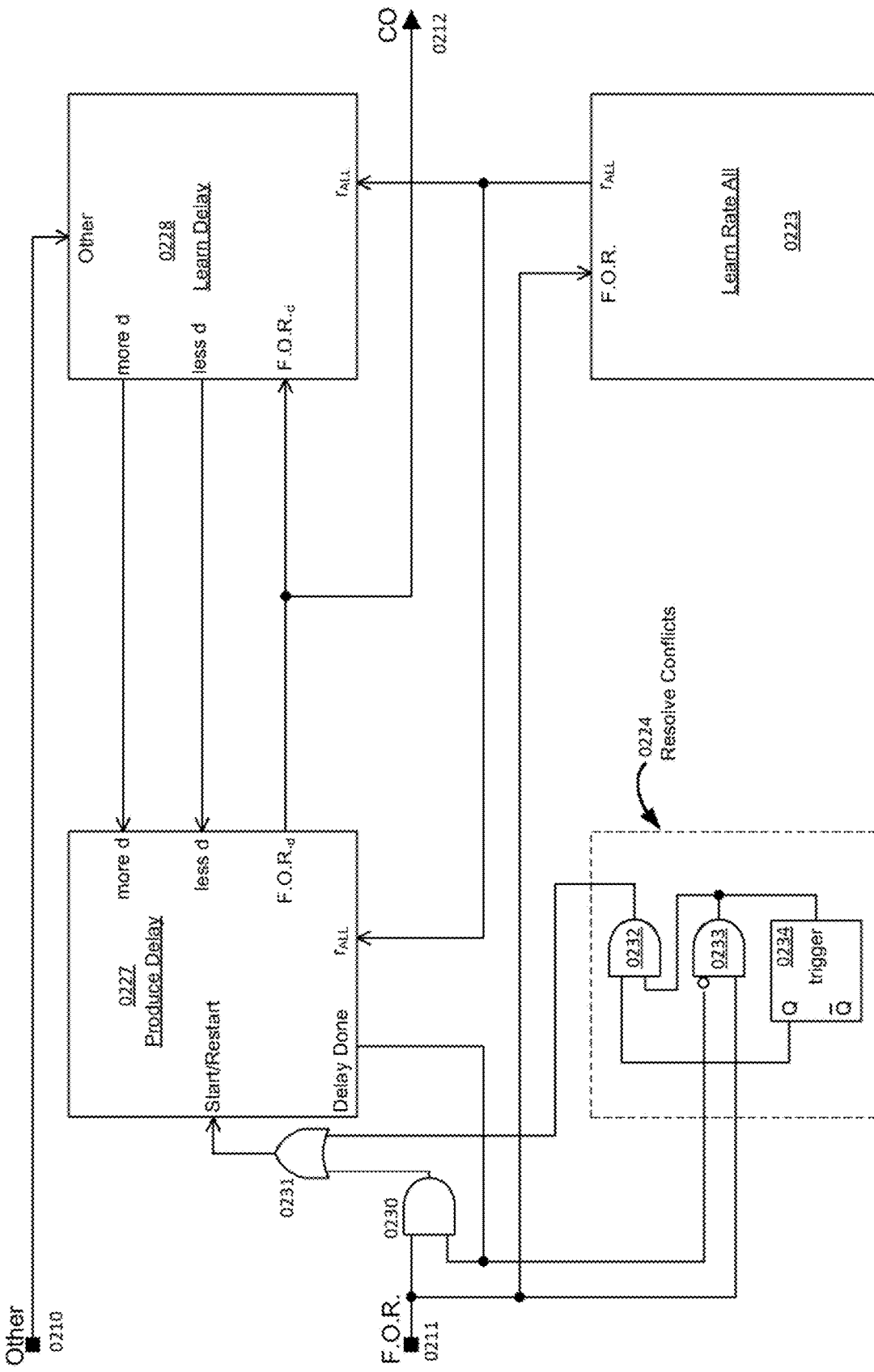
FIG. 11 depicts the same CCU as shown in FIG. 8, except a "Learn Rate All" (or LRA) functional block 0223 is added.

FIG. 11 depicts a CCU the same as FIG. 8, except for the following:
A "Learn Rate All" (or LRA) functional block 0223 is added. As can be seen, LRA 0223 accepts F.O.R. spikes as input, and outputs $r_{ALL}$.
An $r_{ALL}$ input is added to each of Produce Delay and Learn Delay (hence the changing of their label numbers, from 0220 and 0226 of FIGS. 8 to 0227 and 0228 of FIG. 11). These $r_{ALL}$ inputs are driven by the LRA 0223's $r_{ALL}$ output.

Learn Rate All is based on the following property of a stochastic spike stream s: if one has the correct value for $r_{ALL}$, then the following expression provides the probability, as of a time t or any time later, of a next spike occurring:

$$P = e^{-r_{ALL}t} \qquad \text{Equation 1}$$

This also means that, if one generates an exponential decay according to Equation 1, the time at which P=0.5 is the Median Expected Arrival (or MEA) time of a next spike of stream s. This median expected arrival time, that we shall also refer to as $MEA_{ALL}$, has the following special property:

Special Property 1: Over a large number of occurrences of spikes of s, we can expect the number of spikes occurring before $MEA_{ALL}$ will equal the number of spikes occurring after $MEA_{ALL}$.

Figure 12:
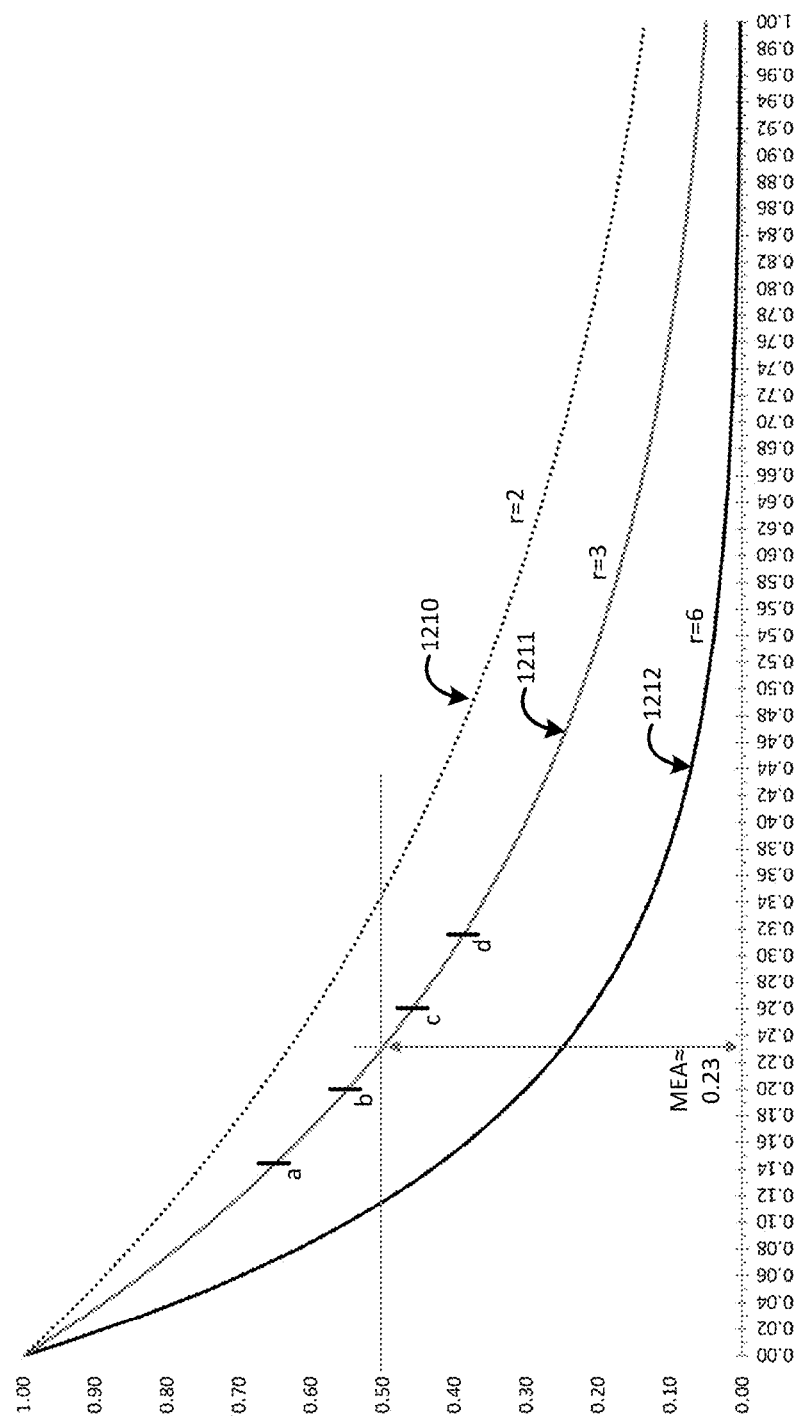
FIG. 12 depicts an example distribution of spikes if the actual MEA$_{ALL}$ is known.

For FIG. 12, the actual $MEA_{ALL}$ is assumed to be 0.23 sec for $r_{ALL}$=3. As can be seen (for purposes of clarity of explanation) spikes a-d have been chosen to be evenly distributed, on either side of $MEA_{ALL}$.

Figure 13:
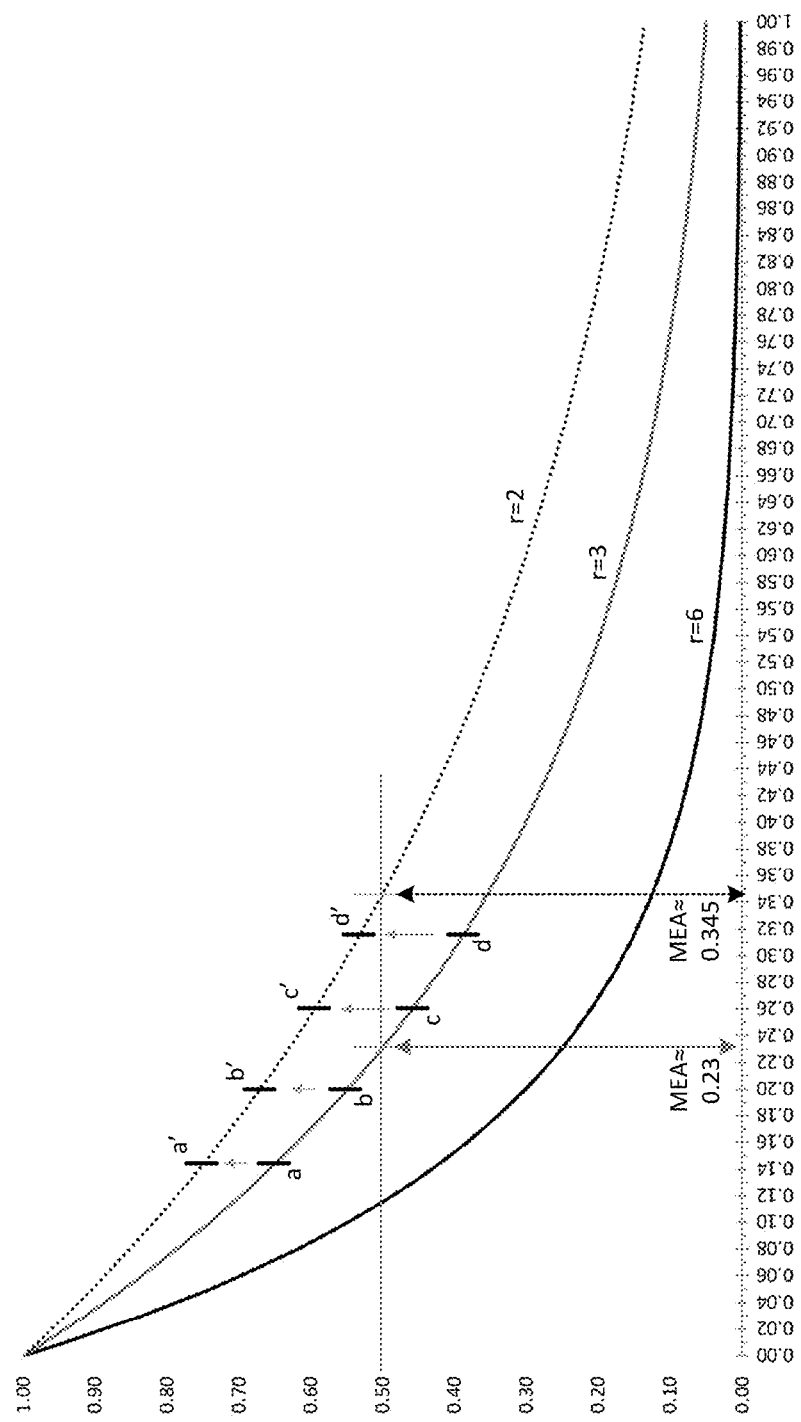
FIG. 13 depicts an example distribution of spikes if a guess for a value of MEA$_{ALL}$ (call it MEA$_{guess}$) is too high.
Figure 14:
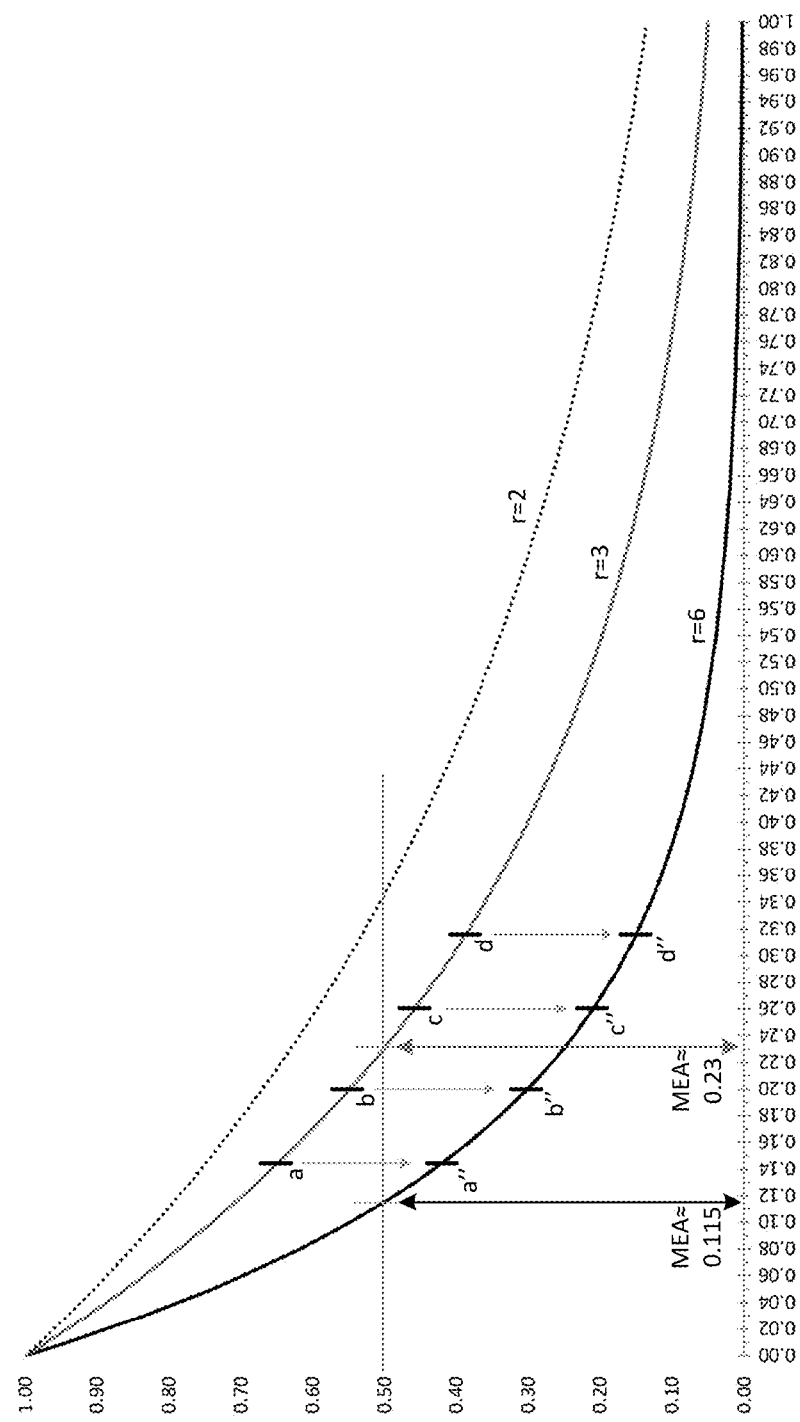
FIG. 14 depicts an example distribution of spikes if a guess for a value of MEA$_{ALL}$ (call it MEA$_{guess}$) is too low.

Special Property 1 has the following implications:
If a guess for a value of $MEA_{ALL}$ (call it $MEA_{guess}$) is too high (i.e., in actuality, $MEA_{guess}$>$MEA_{ALL}$), over a large number of occurrences of spikes of s, more spikes will occur before $MEA_{guess}$ than after $MEA_{guess}$. An extreme example of this is shown by FIG. 13, where $MEA_{guess}$ is 0.345 sec (for r=2), and spikes a-d (labeled a'-d' with respect to their locations for r=2) are all before $MEA_{guess}$.
If a guess for a value of $MEA_{ALL}$ (call it $MEA_{guess}$) is too low (i.e., in actuality, $MEA_{guess}$<$MEA_{ALL}$), over a large number of occurrences of spikes of s, more spikes will occur after $MEA_{guess}$ than before $MEA_{guess}$. An extreme example of this is shown by FIG. 14, where $MEA_{guess}$ is 0.115 sec (for r=6), and the same spikes a-d (now labeled a"-d" with respect to r=6) are all after $MEA_{guess}$.

Special Property 1, along with its implications, provides the basis for a search procedure, by which $MEA_{ALL}$ can be found. That procedure can be described as containing the following two main steps:

1. Choose a reasonable initial value for $MEA_{guess}$:
    The choice of an initial value for $MEA_{guess}$ can be limited, for example, to being within a range of possible values, based on the particular system design, and its intended applications. The value for $MEA_{guess}$ can also be determined by guessing an initial value for r, call it $r_{guess}$, from which $MEA_{guess}$ can be determined. A corresponding time for $MEA_{guess}$ can then be determined from Equation 1. In particular, with P=0.5, and r=$r_{guess}$, Equation 1 becomes:

$$MEA_{guess} = \frac{1}{r_{guess}} \ln 2 \qquad \text{Equation 2}$$

2. For each pair of spikes n and n+1 of stream s, compare the time between the spikes ($t_{n+1}-t_n$) to $MEA_{guess}$:
    If ($t_{n+1}-t_n$)<$MEA_{guess}$, assume (based upon just this latest data point) the guessed value, for $MEA_{guess}$, is too high:
        Reduce the value of $MEA_{guess}$, for purposes of subsequent comparisons between spike pairs.
        Determine the reduced value for $MEA_{guess}$ by incrementing $r_{guess}$ by a standard amount, call it Δr, and then redetermining Equation 2.
    If ($t_{n+1}-t_n$)>$MEA_{guess}$, assume (based upon just this latest data point) the guessed value, for $MEA_{guess}$, is too low:
        Increase the value of $MEA_{guess}$, when comparing subsequent pairs of spikes.
        Determine the increased value for $MEA_{guess}$ by decrementing $r_{guess}$ by a standard amount, call it Δr, and then redetermining Equation 2.

In the above-listed search procedure, for each of its above-described assumptions, for whether $MEA_{guess}$ is too high or too low, here are the following possibilities:
If $MEA_{guess}$ is actually too high, over a large number of spikes, this fact is determined by the occurrence of more comparisons indicating $MEA_{guess}$ is too high than too low, and the value of $MEA_{guess}$ undergoes a net reduction (by means of a net increase of $r_{guess}$).
If $MEA_{guess}$ is actually too low, over a large number of spikes, this fact is determined by the occurrence of more comparisons indicating $MEA_{guess}$ is too low than too high, and the value of $MEA_{guess}$ undergoes a net increase (by means of a net reduction of $r_{guess}$).
$MEA_{guess}$ only achieves a net dynamic stability when it is factually correct (i.e., when $MEA_{guess}$=$MEA_{ALL}$ and $r_{guess}$=$r_{ALL}$).

Thus, over a sufficient number of spikes, $r_{ALL}$ will be determined, with Δr selected to provide a suitable tradeoff, between speed of convergence to $r_{ALL}$ (also called the "learning rate") and accuracy of the $r_{ALL}$ value determined:
    Larger values of Δr increase the learning rate, but reduce accuracy of the result.
    Smaller values of Δr decrease the learning rate, but increase accuracy of the result.

Figure 15:
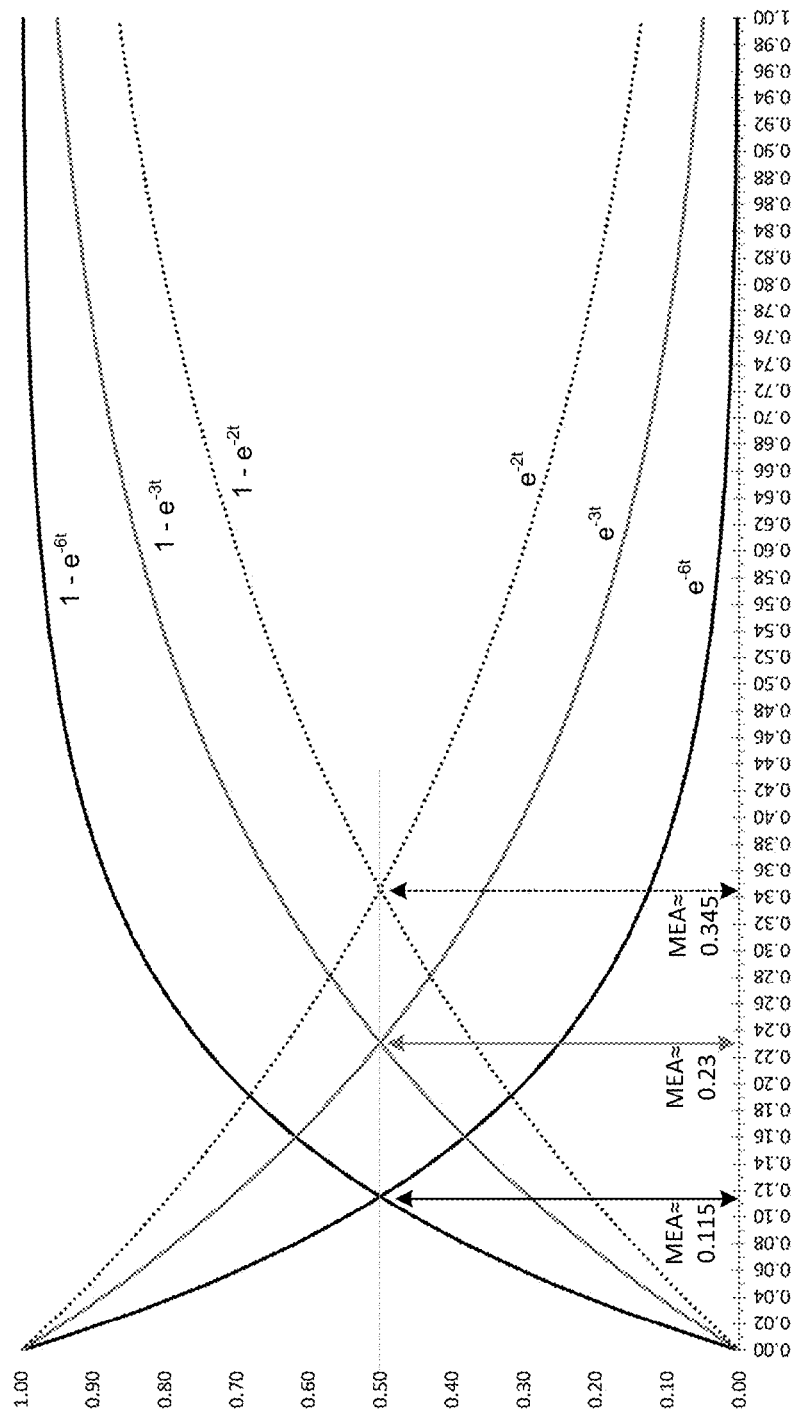
FIG. 15 depicts an equality-testing approach to finding an MEA, rather than solving for the point where an Equation 1 yields half its total range (e.g., P=0.5).

FIG. 15 depicts an alternate way to find an MEA, other than solving for the point where Equation 1 yields half its total range (e.g., P=0.5). The alternate approach is to solve for the time when Equation 1 and the following Equation 3 are equal (where Equation 3 defines a cumulative probability distribution):

$$P_c = 1 - e^{-r_{ALL}t} \quad \text{Equation 3:}$$

As can be seen in FIG. 15, each of the previously discussed MEA's, with respect to FIGS. 12-14, is found by seeking the equality point.

This equality-testing approach is a basis for the hardware implementation of FIG. 16, that can be described as follows.

Figure 16:
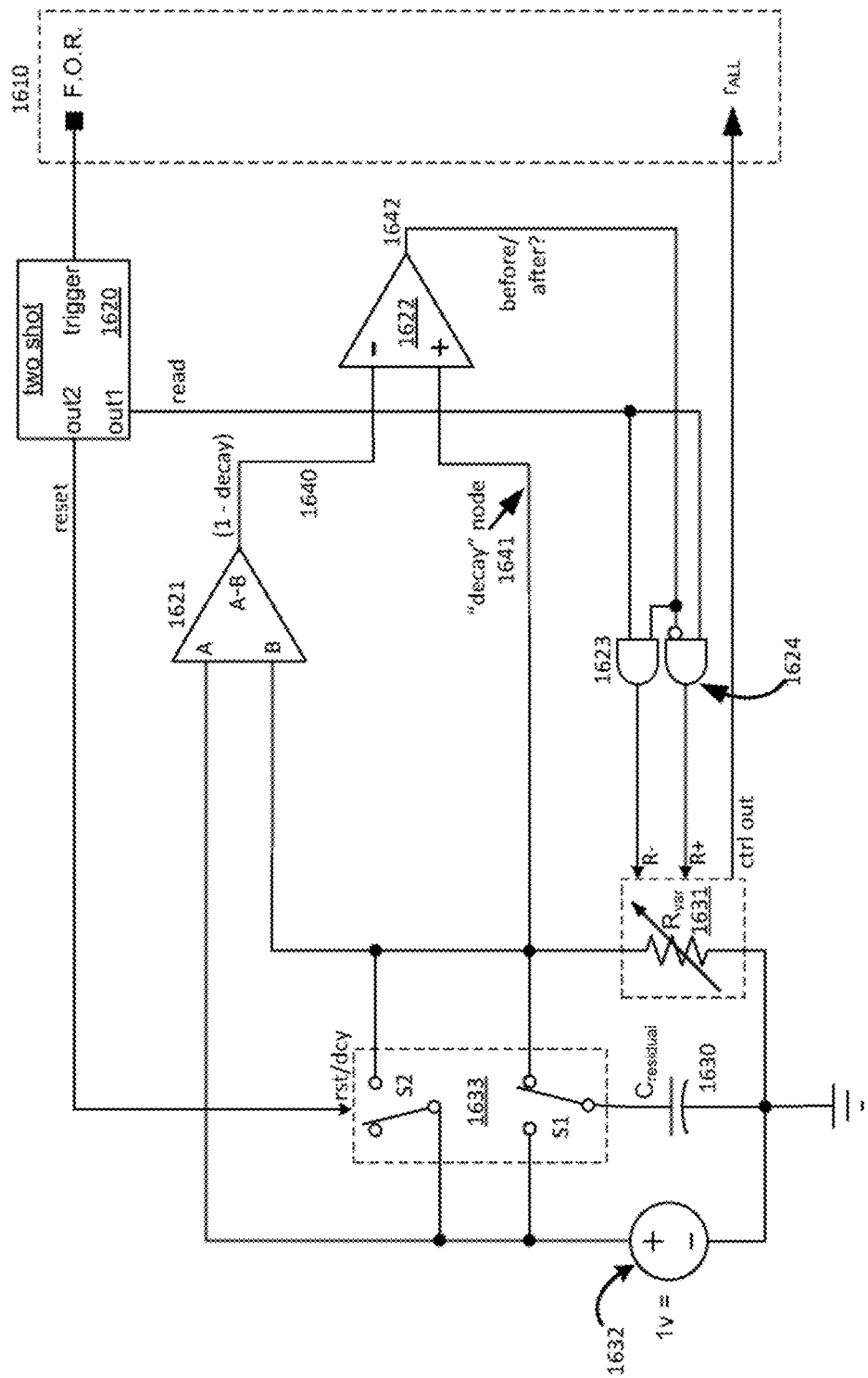
FIG. 16 presents a circuit implementation for Learn Rate All, based on the equality-testing approach.

Outline 1610 of FIG. 16 indicates the external interface for LRA, where each connection corresponds to an input or output of LRA functional block 0223 of FIG. 11.

The exponential decay of Equation 1 is performed, in FIG. 16, by the combination of capacitor 1630 and variable resistor 1631. The decay value is available at "decay" node 1641. Equation 3 (exponential increase) is performed by subtractive amplifier 1621 as follows:

The unit voltage is applied to the amplifier's "A" input.
Decay node 1641 (i.e., Equation 1) is applied to the "B" input.
The output of subtractive amplifier 1621, available at node 1640, is therefore a voltage-level representation of Equation 3.

Equality testing, between Equation 1 and Equation 3, is performed by comparator amplifier 1622, with the result (corresponding to the MEA$_{guess}$ of the above explanation) available at node 1642.

Each time a spike n is present, at the F.O.R. input of interface 1610, two-shot 1620 is triggered. The first step, activated by out1 of the two-shot, is to complete the MEA measurement begun with the last F.O.R. spike n−1. Out1 does this by enabling AND gates 1623 and 1624 to read the output of comparator 1622.

The output of comparator 1622 can be interpreted as follows:

Comparator 1622 outputs a logical 1 if the comparison indicates a time period, between spikes n−1 and n, less than the current MEA$_{guess}$. This is because exponential decay node 1641 drives the +input of the comparator.
Comparator 1622 outputs a logical 0 if the comparison indicates a time duration, between spikes n−1 and n, greater than the current MEA$_{guess}$. This is because exponential increase node 1640 drives the −input of the comparator.

If the current measurement by comparator 1622 indicates MEA$_{guess}$ is too high, the logical 1 on node 1642 causes AND gate 1623 to be enabled, and the out1 pulse is applied to the R− input of variable resistor 1631. As can be appreciated, decreasing resistance causes a faster rate of decay at "decay" node 1641, and a downward adjustment to MEA$_{guess}$.

Conversely, if the current measurement by comparator 1622 indicates MEA$_{guess}$ is too low, the logical 0 on node 1642 causes AND gate 1624 to be enabled, and the out1 pulse is applied to the R+ input of variable resistor 1631. As can be appreciated, increasing resistance causes a slower rate of decay at "decay" node 1641, and an upward adjustment to MEA$_{guess}$.

Such factors as the duration of the out1 pulse, and the particular construction of variable resistor 1631, determine the increment of change to r$_{guess}$, where the magnitude of each such increment of change is referred to as the Δr "learning rate" in the above discussion.

The state of variable resistor 1631 (i.e., its current resistance level) can be kept by an internal state capacitor (not shown). The voltage of this capacitor can, for example, be increased with each pulse to the R− input, and decreased with each pulse to R+. Further, the voltage of the internal state capacitor can be made available through a voltage-following amplifier (also not shown), that drives the r$_{ALL}$ output of LRA's external interface 1610.

As discussed above with respect to FIG. 11, LRA 0223 can provide its r$_{ALL}$ output to the r$_{ALL}$ input of each of Produce Delay 0227 and Learn Delay 0228.

Figure 17:
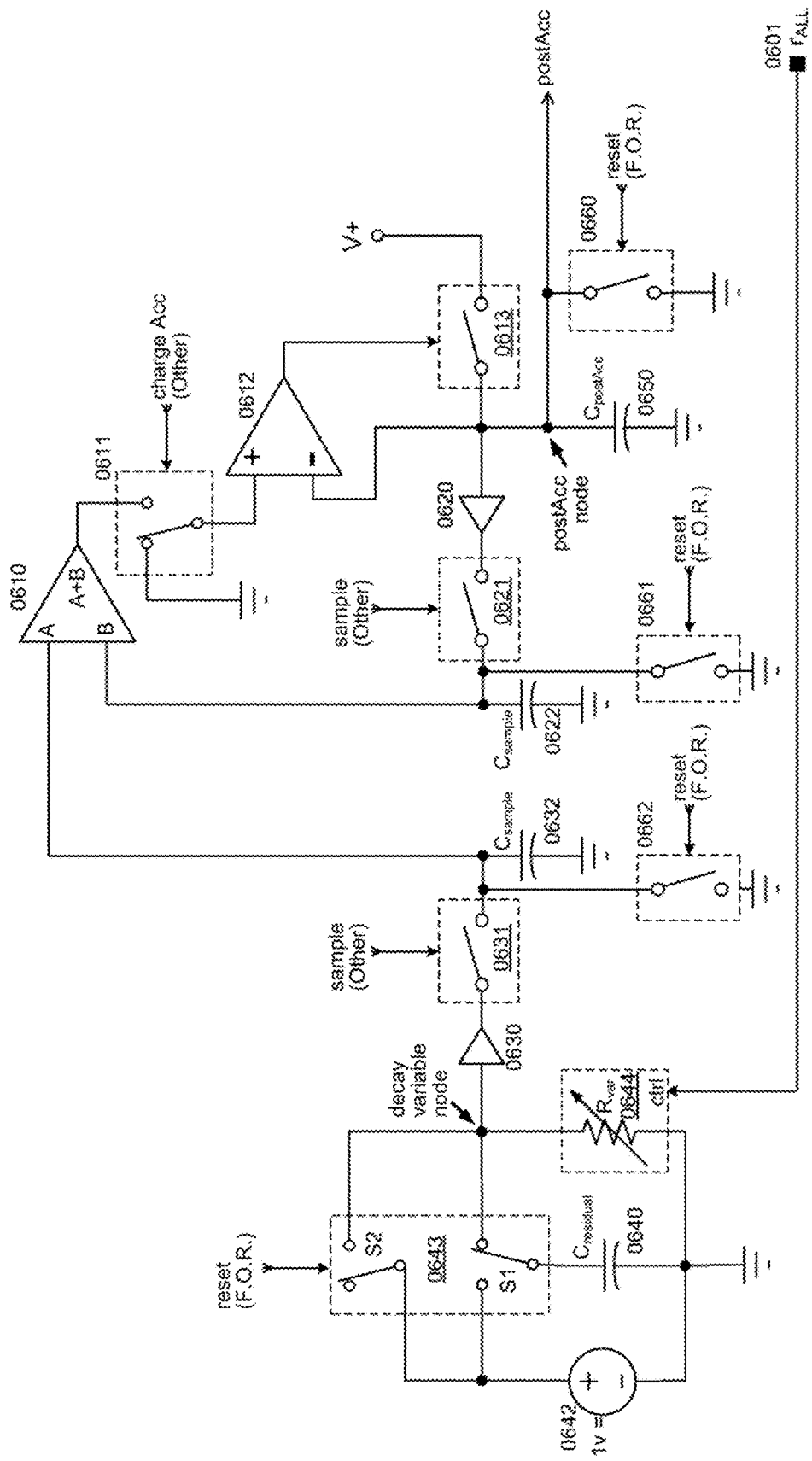
FIGS. 17 and 18 present the same circuit implementation of Learn Delay shown in, respectively, FIGS. 6 and 7, except hardware for an r$_{ALL}$ input is added.
Figure 18:
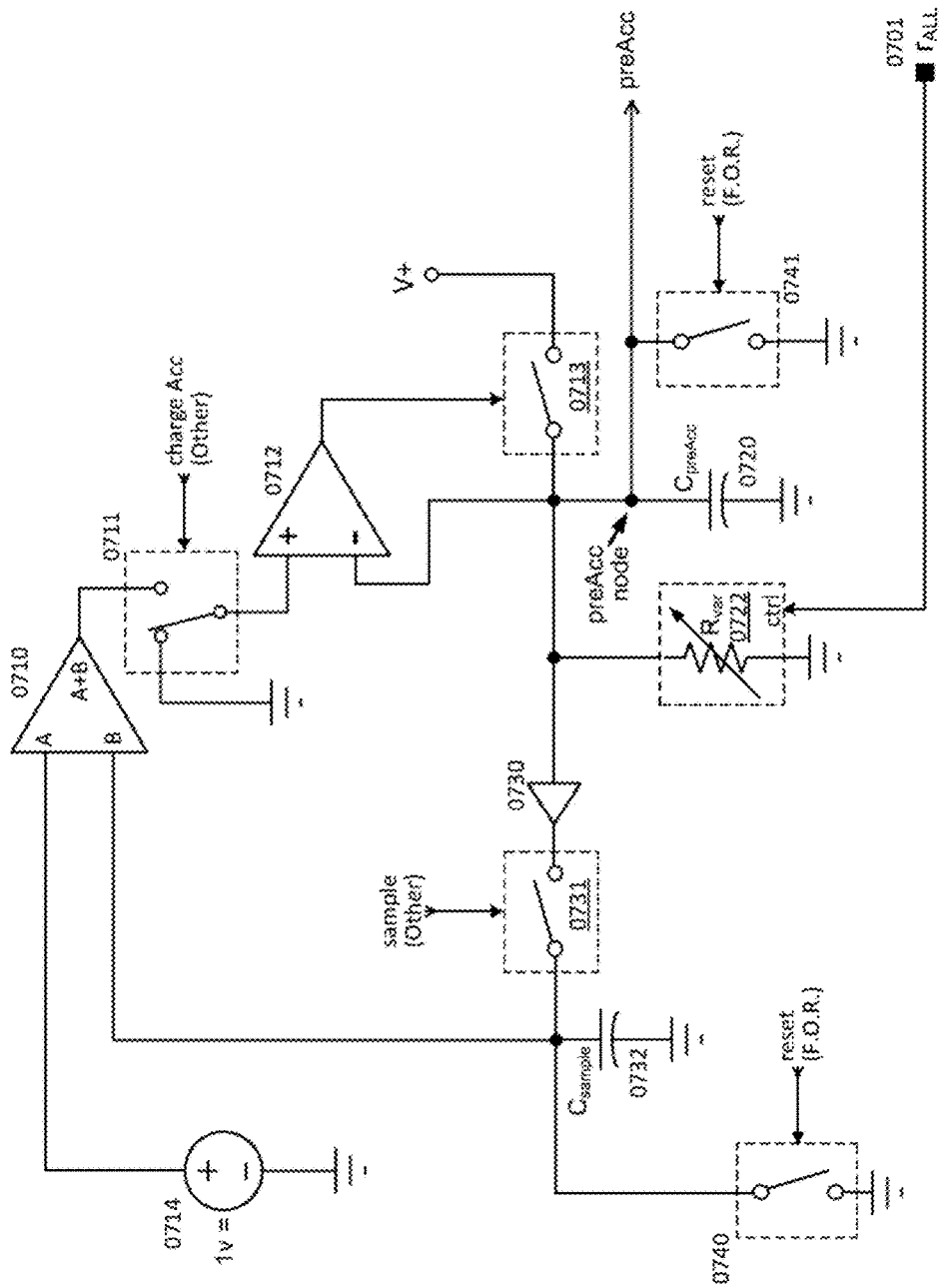

The portion of Learn Delay 0226's circuit implementation, changed by adding an r$_{ALL}$ input, is FIGS. 6 and 7. For a circuit implementation of Learn Delay 0228, FIGS. 6 and 7 are replaced by, respectively, FIGS. 17 and 18. FIGS. 17 and 18 differ from FIGS. 6 and 7 as follows:

Fixed resistor 0641 (FIG. 6) is replaced with variable resistor 0644 (FIG. 17) that accepts an r$_{ALL}$ input 0601.
Fixed resistor 0721 (FIG. 7) is replaced with variable resistor 0722 (FIG. 18) that accepts an r$_{ALL}$ input 0701.

Figure 19:
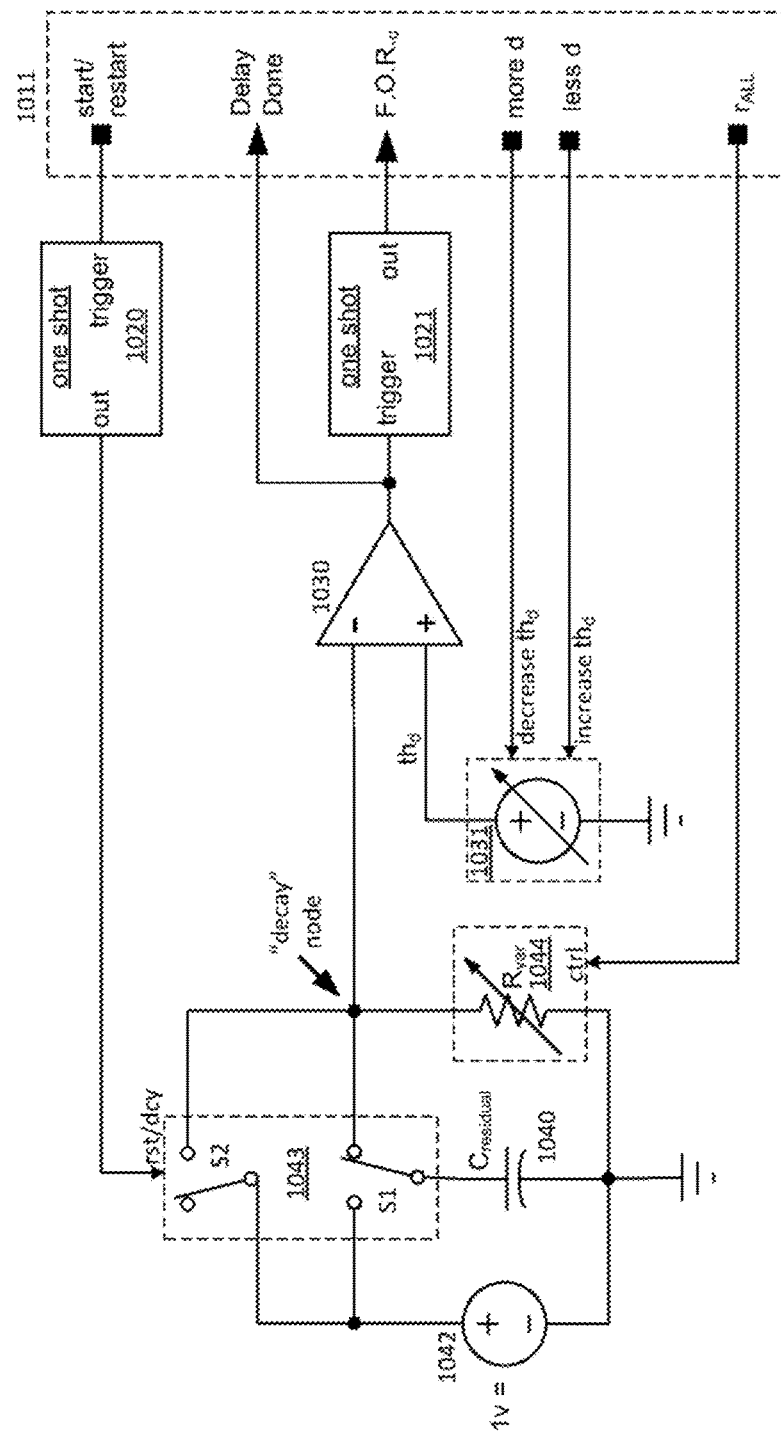
FIG. 19 presents the same circuit implementation of Produce Delay shown in FIG. 10, except hardware for an r$_{ALL}$ input is added.

For a circuit implementation of Produce Delay 0227, FIG. 10 is replaced by FIG. 19. FIG. 19 differs from FIG. 10 as follows: fixed resistor 1041 (FIG. 10) is replaced with variable resistor 1044 (FIG. 19) that accepts an r$_{ALL}$ input as part of its external interface 1011.

In order that the voltage at LRA's r$_{ALL}$ output produce exponential decay curves (for Produce Delay 0227 and Learn Delay 0228) with an r equal to the r$_{ALL}$ found by LRA 0223, the following can be done:

Capacitors 0640 (see FIG. 17's implementation of post-Acc), 0720 (see FIG. 18's implementation of preAcc), and 1040 (see FIG. 19's implementation of Produce Delay) can be made to have the same capacitance as LRA's capacitor 1630 (see FIG. 16).
Variable resistors 0644 (see FIG. 17's implementation of postAcc), 0722 (see FIG. 18's implementation of pre-Acc), and 1044 (see FIG. 19's implementation of Produce Delay) can be made the same as LRA's variable resistor 1631 (see FIG. 16), except for the following: rather than keep an internal state, each of 0644, 0722, and 1044 uses a voltage follower, driven by its external interface r$_{ALL}$ input.

3 Glossary of Selected Terms

Additive amplifier: At any instant in time, outputs a voltage that is a sum of the voltages present at its inputs.
One shot: Has an input trigger and one output. Upon receipt of a trigger signal, produces a pulse at its output.
Spike: As used herein, a spike can refer to any point in a signal that can be regarded as having essentially (or approximately) zero transition time, between two distinct levels.
Subtractive amplifier: At any instant in time, outputs the voltage resulting from subtracting the voltage present at a second input from the voltage present at a first input.
Two shot: Has an input trigger and two outputs. Upon receipt of a trigger signal, sequentially produces a pulse at each of its two outputs.

4 Computing Equipment

In accordance with what is ordinarily known by those in the art, the inventive methods, procedures, or techniques, described herein, can be implemented through the use of any suitable computing hardware. Suitable hardware can include the use of one or more general purpose computers or processors. Hardware implementation techniques can include the use of various types of integrated circuits, programmable memories (volatile and non-volatile), or both.

Computational hardware, whether in integrated circuit form or otherwise, is typically based upon the use of transistors (field effect, bipolar, or both), although other types of components (e.g., optical, microelectromechanical, or magnetic) may be included. Any computational hardware has the property that it will consume energy, as a necessary part of being able to perform its function. Also, regardless of how quickly it can be made to operate, computational hardware will require some amount of time to change state. Because of its basis on physical devices (electronic or otherwise), computational hardware, however small, will occupy some amount of physical space.

Programmable memories are also often implemented in integrated circuit form, and are subject to the same physical limitations described above for computational hardware. A programmable memory is intended to include devices that use any kind of physics-based effects or properties, in order to store information in at least a non-transitory way, and for an amount of time commensurate with the application. The types of physical effects used to implement such storage, include, but are not limited to: maintenance of a particular state through a feedback signal, charge storage, changes to optical properties of a material, magnetic changes, or chemical changes (reversible or irreversible).

Unless specifically indicated otherwise, the terms computational hardware, programmable memory, computer-readable media, system, and sub-system, do not include persons, or the mental steps a person may undertake.

For any method, procedure or technique described above, to the extent it is implemented as the programming of a computer or other data processing system, it can also be described as a computer program product. A computer program product can be embodied on any suitable computer-readable medium or programmable memory.

The kind of information described herein (such as data and/or instructions), that is on computer-readable media and/or programmable memories, can be stored on computer-readable code devices embodied therein. A computer-readable code device can represent that portion of a memory in which a defined unit of information (such as a bit) can be stored, from which a defined unit of information can be retrieved, or both.

While the invention has been described in conjunction with specific embodiments, it is evident that many alternatives, modifications and variations will be apparent in light of the foregoing description. Accordingly, the invention is intended to embrace all such alternatives, modifications and variations as fall within the spirit and scope of the appended claims and equivalents.

What is claimed is:

1. A method for cross correlation, comprising:
  receiving, performed at least in part with a configuration of electronic hardware, a first spike stream containing significant stochastic content, and a first event;
  receiving, performed at least in part with a configuration of electronic hardware, a second spike stream containing significant stochastic content, and a second event, wherein the first and second events have a fixed temporal relationship;
  inputting, performed at least in part with a configuration of electronic hardware, the first spike stream into a first delay unit;
  outputting, performed at least in part with a configuration of electronic hardware, a first delayed spike stream from the first delay unit, wherein a first delay, produced by the first delay unit, has a lower bound of zero seconds;
  comparing, upon receipt of a first delayed spike from the first delayed spike stream, performed at least in part with a configuration of electronic hardware, a first accumulated value with a second accumulated value to produce a first comparison result;
  increasing the first delay if the first comparison result indicates the first accumulated value is greater than the second accumulated value;
  decreasing the first delay if the first comparison result indicates the first accumulated value is less than the second accumulated value;
  resetting, after the first comparison result is produced, the first accumulated value and the second accumulated value;
  restarting, after the first comparison result is produced, a first process for producing a first weighting function, and a second weighting function, wherein the first weighting function is monotonically decreasing and the second weighting function is both monotonically increasing and symmetrically opposite to the first weighting function;
  accumulating a first weighting value into a first accumulator, in accordance with the first weighting function, upon receipt of a second spike from the second spike stream; and
  accumulating a second weighting value into a second accumulator, in accordance with the second weighting function, upon receipt of the same second spike from the second spike stream.

2. The method of claim 1, further comprising:
  increasing the first delay by increasing the length of a first queue, comprising the first delay unit; and
  decreasing the first delay by decreasing the length of a first queue.

3. The method of claim 1, further comprising:
  timing a duration equal to the first delay, upon an input to the first delay unit of a first undelayed spike from the first spike stream, if a timing by the first delay unit is not already started;
  outputting a spike, upon a completion of any timing of the first delay;
  deciding, based upon a first state for a first decision variable, and receipt of a second undelayed spike during a time duration for a prior undelayed spike, to continue with the time duration for the prior undelayed spike;
  deciding, based upon a second state for the first decision variable, and receipt of the second undelayed spike during the time duration for the prior undelayed spike, to restart a timing of the first delay by the first delay unit;
  ensuring over multiple instances, of receipt of the second undelayed spike during the time duration for the prior undelayed spike, approximately equal occurrences, for the first decision variable, of the first and second states.

4. The method of claim 1, further comprising:
  increasing a first average spike rate, for generating both a first exponential decrease function and a first exponential increase function, if, at a time of receipt of a first undelayed spike from the first spike stream, the first exponential decrease function is greater than the first exponential increase function;
  decreasing a first average spike rate, for generating both a first exponential decrease function and a first exponential increase function, if, at the time of receipt of the first undelayed spike from the first spike stream, the first exponential decrease function is less than the first exponential increase function; and using the first average spike rate for producing the first and second weighting functions.

5. The method of claim 3, further comprising:

increasing a first average spike rate, for generating both a first exponential decrease function and a first exponential increase function, if, at a time of receipt of a first undelayed spike from the first spike stream, the first exponential decrease function is greater than the first exponential increase function;

decreasing a first average spike rate, for generating both a first exponential decrease function and a first exponential increase function, if, at the time of receipt of the first undelayed spike from the first spike stream, the first exponential decrease function is less than the first exponential increase function; and using the first average spike rate for timing the first delay.

* * * * *